(12) United States Patent
Shimizu et al.

(10) Patent No.: US 11,828,621 B2
(45) Date of Patent: Nov. 28, 2023

(54) SENSOR UNIT AND STRUCTURE FOR ATTACHING SENSOR UNIT

(71) Applicant: HOSIDEN CORPORATION, Yao (JP)

(72) Inventors: Masato Shimizu, Yao (JP); Takeshi Isoda, Yao (JP)

(73) Assignee: HOSIDEN CORPORATION, Yao (JP)

( * ) Notice: Subject to any disclaimer, the term of this patent is extended or adjusted under 35 U.S.C. 154(b) by 283 days.

(21) Appl. No.: 17/235,146

(22) Filed: Apr. 20, 2021

(65) Prior Publication Data

US 2021/0333133 A1 Oct. 28, 2021

(30) Foreign Application Priority Data

Apr. 27, 2020 (JP) ................. 2020-078619

(51) Int. Cl.
  *G01D 11/30* (2006.01)
  *G01D 11/10* (2006.01)
  *G01D 11/24* (2006.01)

(52) U.S. Cl.
  CPC ............. *G01D 11/30* (2013.01); *G01D 11/10* (2013.01); *G01D 11/24* (2013.01)

(58) Field of Classification Search
  CPC ......... G01D 11/30; G01D 11/10; G01D 11/24
  See application file for complete search history.

(56) References Cited

U.S. PATENT DOCUMENTS

| 2013/0154984 | A1* | 6/2013 | Gondo | G06F 3/041 345/173 |
| 2014/0305783 | A1 | 10/2014 | Kagayama | |
| 2017/0293359 | A1* | 10/2017 | Ikuta | B60K 37/06 |
| 2018/0339592 | A1* | 11/2018 | Aubry | G06F 3/016 |
| 2019/0339776 | A1* | 11/2019 | Rosenberg | G06F 3/045 |

FOREIGN PATENT DOCUMENTS

| JP | 2012-173896 A | 9/2012 | |
| JP | 2012173896 A | * 9/2012 | |
| WO | 2012137442 A | 10/2012 | |
| WO | WO-2012137442 A1 | * 10/2012 | G06F 1/1626 |

OTHER PUBLICATIONS

Extended European search report issued by the European Patent Office for European patent application No. 21168072.3, dated Sep. 30, 2021, 8 pages.

* cited by examiner

*Primary Examiner* — Jamel E Williams
(74) *Attorney, Agent, or Firm* — Kilyk & Bowersox, P.L.L.C.

(57) ABSTRACT

A sensor unit attachable to a hole of a housing, closed by an overlay on one side in the first direction, from the other side in the first direction. The sensor unit includes a body, a sensor, a vibration generator, a vibration damper, and a fixable part. The body includes a first portion and a second portion on the other side in the first direction relative to the first portion. The sensor provided at the body detects a contact of a detection target with the overlay. The vibration generator can vibrate the body and sensor. The fixable part is provided at the second portion of the body. With the first portion accommodated in the hole, the fixable part is fixed to the housing from the other side in the first direction via the vibration damper, and the vibration damper is at least partly interposed between the fixable part and housing.

24 Claims, 19 Drawing Sheets

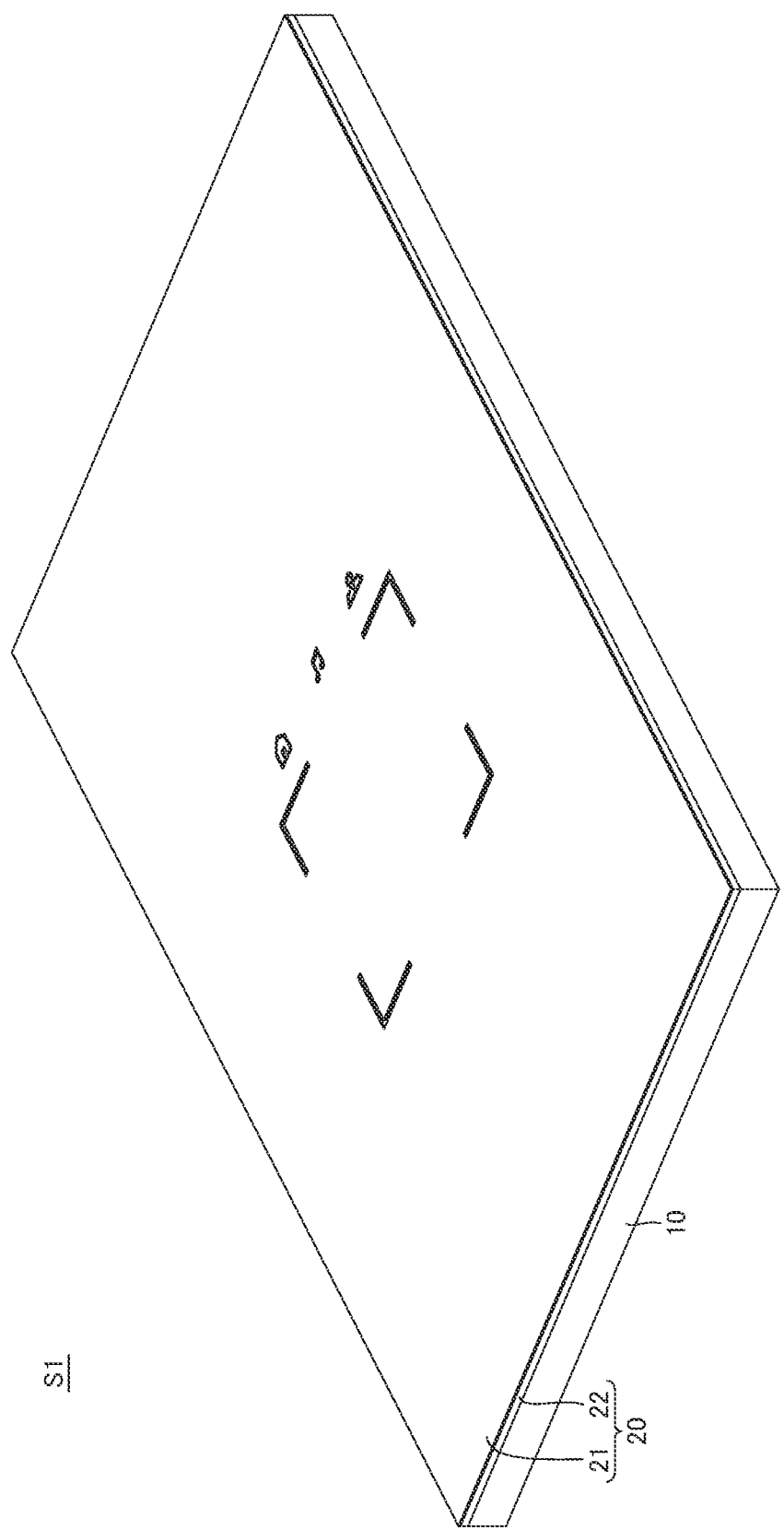

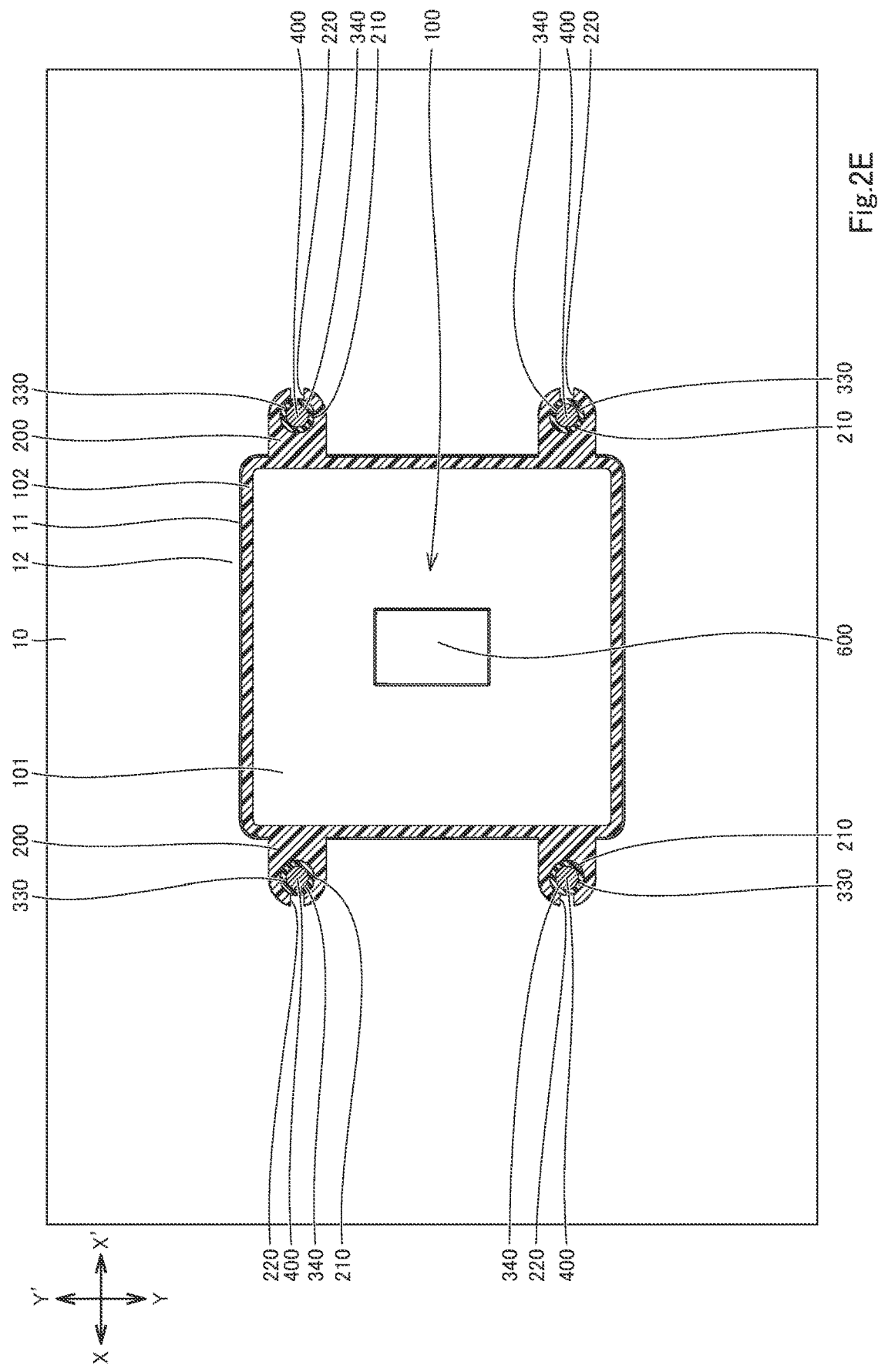

SENSOR UNIT AND STRUCTURE FOR ATTACHING SENSOR UNIT

CROSS-REFERENCE TO RELATED APPLICATIONS

The present application claims priority under 35 U.S.C. § 119 of Japanese Patent Application No. 2020-078619 filed on Apr. 27, 2020, the disclosure of which is expressly incorporated by reference herein in its entirety.

BACKGROUND OF THE INVENTION

Technical Field

The invention relates to sensor units and structures for attaching the sensor units.

Background Art

Japanese Unexamined Patent Application Publication No. 2012-173896 (hereinafter referred to as "literature") describes a conventional structure for attaching a sensor unit. This structure includes a housing having a square ring shape, an elastic member having a square ring shape, and a sensor unit. The housing includes an accommodation hole, a pair of edges, and a pair of supports. The accommodation hole extends through the housing. The edges are opposite edges of the accommodation hole of the housing and have respective inner faces on a side of the accommodation hole. The supports are metal plates fixed to the inner faces of the edges and accommodated in the accommodation hole. The elastic member is accommodated in the accommodation hole from one side in the extending direction of the accommodation hole and supported on the supports. The sensor unit includes a touch sensor and a piezoelectric element. The touch sensor is placed on the elastic member from the one side in the extending direction and is screwed to the supports. The touch sensor includes a first face on the one side in the extending direction and a second face on the opposite side. The piezoelectric element is adhered to the second face of the touch sensor. The sensor unit is configured such that when the touch sensor detects a contact of a detection target, the piezoelectric element expands and contracts to vibrate the touch sensor. The abutment of the touch sensor on the elastic member makes it difficult to attenuate a vibration of the touch sensor.

SUMMARY OF INVENTION

In short, the above literature only discloses a configuration that the elastic member and the sensor unit are attached from the one side in the extending direction, i.e., from the side of the operation face (front side) of the touch sensor.

The invention provides a sensor unit attachable to a housing from the back side thereof. The invention also provides a structure for attaching the sensor unit.

A sensor unit of an aspect of the invention is attachable to an accommodation hole. The accommodation hole extends through a housing in a first direction and is closed by an overlay on one side in the first direction. The sensor unit is attachable to the accommodation hole from the other side in the first direction. The sensor unit includes a body, a detection sensor, a vibration generator, a vibration damper constituted by an elastic substance, and a fixable part. The body includes a first portion and a second portion on the other side in the first direction relative to the first portion. The first portion is accommodatable in the accommodation hole of the housing from the other side in the first direction. The second portion is located on the other side in the first direction relative to the accommodation hole in a state where the first portion is accommodated in the accommodation hole (this state will be referred to as "accommodation state"). The detection sensor is provided at the body. The detection sensor is configured in the accommodation state to detect a contact of a detection target with the overlay from the one side in the first direction. The vibration generator is configured in the accommodation state to vibrate the body and the detection sensor and thereby provide a tactile feedback to the detection target in contact with the overlay. The fixable part is provided at the second portion of the body. The fixable part is located on the other side in the first direction relative to the housing in the accommodation state. In the accommodation state, the fixable part is fixed to the housing from the other side in the first direction via the vibration damper, and the vibration damper is at least partly interposed between the fixable part and the housing.

The sensor unit of this aspect is configured such that the first portion of the body is accommodable in the accommodation hole of the housing from the other side in the first direction (from the back side). This is because, in the accommodation state, the second portion of the body is located on the other side in the first direction relative to the accommodation hole, and the fixable part provided in the second portion is located on the other side in the first direction relative to the housing. It is therefore possible to attach the fixable part to the housing from the other side in the first direction by fixing the fixable part to the housing from the other side in the first direction via the vibration damper. Moreover, the vibration damper, at least partly interposed between the fixable part and the housing in the accommodation state, can absorb vibrations of the body, the fixable part, and the detection sensor which are vibrated by the vibration generator.

The vibration damper may include a first vibration damper constituted by an elastic substance. In the accommodation state, the fixable part may be fixed to the housing from the other side in the first direction via the first vibration damper. In this state, the first vibration damper may be interposed between the fixable part and the housing.

The sensor unit may further include a fixing part. The fixing part may be configured in the accommodation state to fix the fixable part and the vibration damper to the housing from the other side in the first direction.

The fixing part may include an abuttable portion located on the other side in the first direction relative to the vibration damper.

The vibration damper may further include a second vibration damper constituted by an elastic substance. In a state where the fixing part fixes the fixable part and the vibration damper to the housing from the other side in the first direction, the first vibration damper may be interposed between the fixable part and the housing, and the second vibration damper may be interposed between the fixable part and the abuttable portion of the fixing part.

The vibration damper may further include at least one first protrusion constituted by an elastic substance. The at least one first protrusion may extend from the first vibration damper to the one side in the first direction, and may be elastically deformable such as to contract in the first direction. In the state where the fixable part is fixed to the housing from the other side in the first direction via the vibration damper, the first vibration damper may abut the fixable part, and the at least one first protrusion may be held between the first vibration damper and the housing.

The vibration damper may further include at least one second protrusion constituted by an elastic substance. The at least one second protrusion may extend from the second vibration damper to the other side in the first direction, and may be elastically deformable such as to contract in the first direction. In the state where the fixable part is fixed to the housing from the other side in the first direction via the vibration damper, the second vibration damper may abut the fixable part, and the at least one second protrusion may be held between the second vibration damper and the abuttable portion of the fixing part.

The sensor unit may further include a relay. The relay may be fixed to the fixable part. In this case, the relay, in place of the fixable part, may be fixed to the housing from the other side in the first direction in the accommodation state. The vibration damper may be at least partly interposed between the fixable part and the relay, rather than between the fixable part and the housing.

Where the relay is provided and the vibration damper includes the first vibration damper, the relay may include a first abuttable portion located on the one side in the first direction relative to the first vibration damper. In this case, the first vibration damper may be at least partly interposed between the fixable part and the first abuttable portion of the relay, rather than between the fixable part and the housing.

Where the relay is provided and the vibration damper includes the second vibration damper, the relay may include a second abuttable portion located on the other side in the first direction relative to the second vibration damper. In this case, the second vibration damper may be at least partly interposed between the fixable part and the second abuttable portion of the relay, rather than between the fixable part and the abuttable portion of the fixing part.

When the relay is provided and the vibration damper includes the first vibration damper and the at least one first protrusion, the first vibration damper may abut the fixable part, and the at least one first protrusion may be held between the first vibration damper and the first abuttable portion of the relay, rather than between the first vibration damper and the housing.

Where the relay is provided and the vibration damper includes the second vibration damper and the at least one second protrusion, the second vibration damper may abut the fixable part, and the at least one second protrusion may be held between the second vibration damper and the second abuttable portion of the relay, rather than between the second vibration damper and the abuttable portion of the fixing part.

The first portion of the body may include a first face on the one side in the first direction.

The first face of the body may have a shape and size, as viewed from the one side in the first direction, that is substantially the same as the shape and size of the accommodation hole of the housing. In the accommodation state, the first face of the body may be arranged substantially continuously with a face on the one side in the first direction of a perimeter area of the accommodation hole of the housing.

The detection sensor may have a first face on the one side in the first direction and a second face on the other side in the first direction. The second face of the detection sensor may abut the first face of the body.

The detection sensor may have a shape and size, as viewed from the one side in the first direction, that is substantially the same as the shape and size of the accommodation hole of the housing. In the accommodation state, the first face of the detection sensor may be arranged substantially continuously with a face on the one side in the first direction of a perimeter area of the accommodation hole of the housing.

The body may be a tube with a bottom closing the one side in the first direction of the body. In this case, the vibration generator may be accommodated in, and fixed to, the body. Where the body is not a tube with a bottom, the vibration generator may be fixed to the body. Alternatively, the vibration generator may be fixed to a member other than body and configured to vibrate the body and the detection sensor in a manner described above.

A structure for attaching a sensor unit according to an aspect of the invention includes a housing, an overlay, and the sensor unit according to one of the above aspects. The housing is provided with an accommodation hole, the accommodation hole extending through the housing in the first direction. The overlay closes the accommodation hole of the housing from the one side in the first direction.

Where the sensor unit does not include the relay, the first portion of the body of the sensor unit may be accommodated in the accommodation hole, the body and/or the detection sensor of the sensor unit may abut the overlay, the fixable part of the sensor unit may be fixed to the housing from the other side in the first direction via the vibration damper, and the vibration damper of the sensor unit may be at least partly interposed between the fixable part and the housing.

Where the sensor unit includes the relay, the first portion of the body of the sensor unit may be accommodated in the accommodation hole, the body and/or the detection sensor of the sensor unit may abut the overlay, and the relay of the sensor unit may be fixed to the housing from the other side in the first direction.

The overlay may be made of a flexible and/or elastic material.

The overlay may cover at least a perimeter area of the accommodation hole of the housing and the body of the sensor unit.

The overlay may include a cushioning portion and a covering portion. The cushioning portion may be made of an elastic material, may close the accommodation hole of the housing from the one side in the first direction, and may cover at least a perimeter area of the accommodation hole of the housing and the body of the sensor unit. The covering portion may cover the cushioning portion from the one side in the first direction. In this case, the body and/or the detection sensor may abut the cushioning portion.

The cushioning portion may be recessed conforming to a shape of the detection sensor.

BRIEF DESCRIPTION OF DRAWINGS

FIG. 1A is a front, top, right side perspective view of a structure for attaching a sensor unit according to a first embodiment of the invention.

FIG. 2E is a cross-sectional view of the structure, taken along line 2E-2E in FIG. 2A.

Figure 1B:
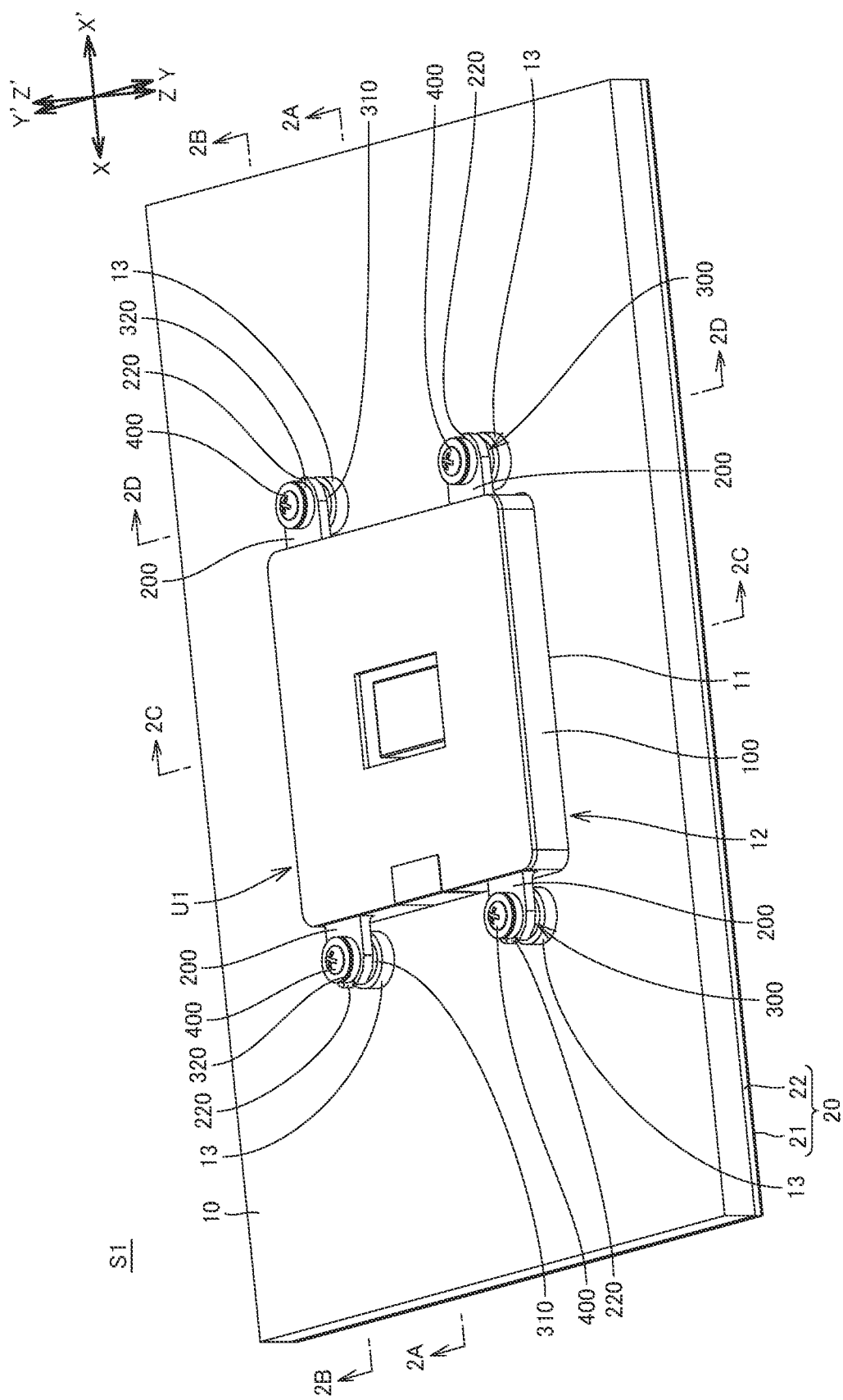
FIG. 1B is a front, bottom, left side perspective view of the structure.
Figure 2A:
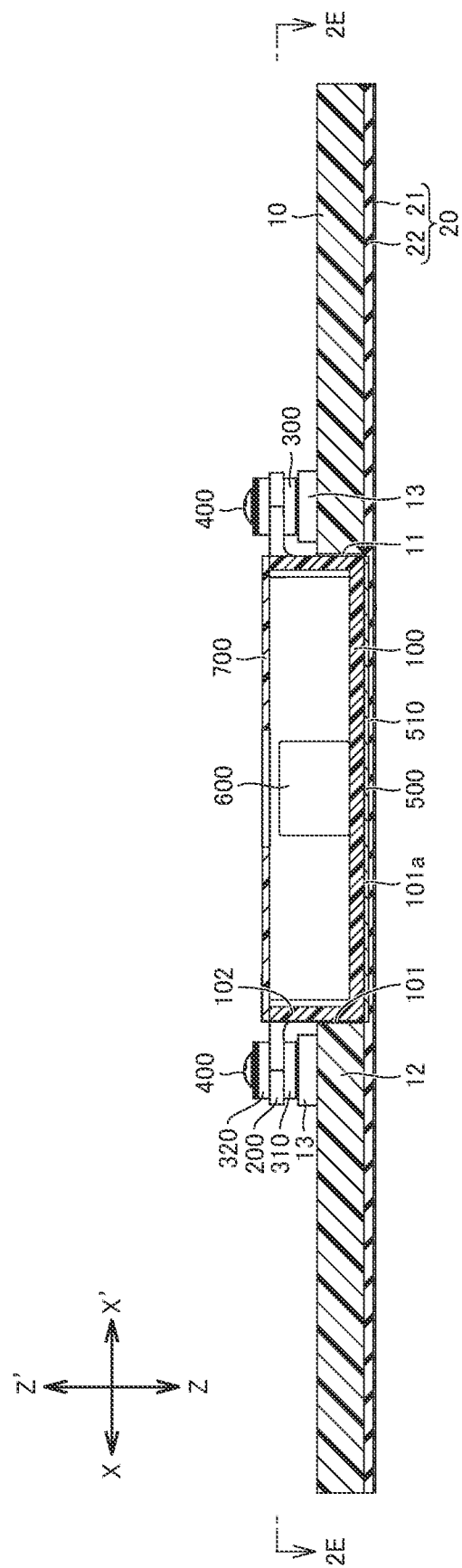
FIG. 2A is a cross-sectional view of the attaching, taken along line 2A-2A in FIG. 1B.
Figure 2B:
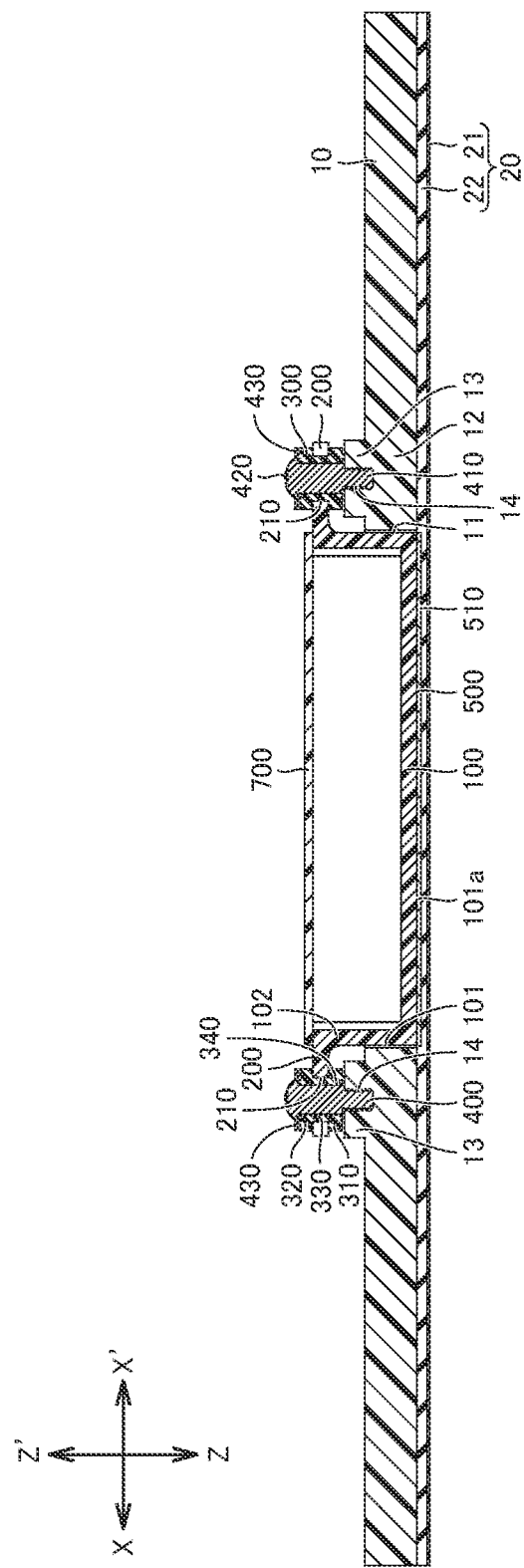
FIG. 2B is a cross-sectional view of the structure, taken along line 2B-2B in FIG. 1B.
Figure 2C:
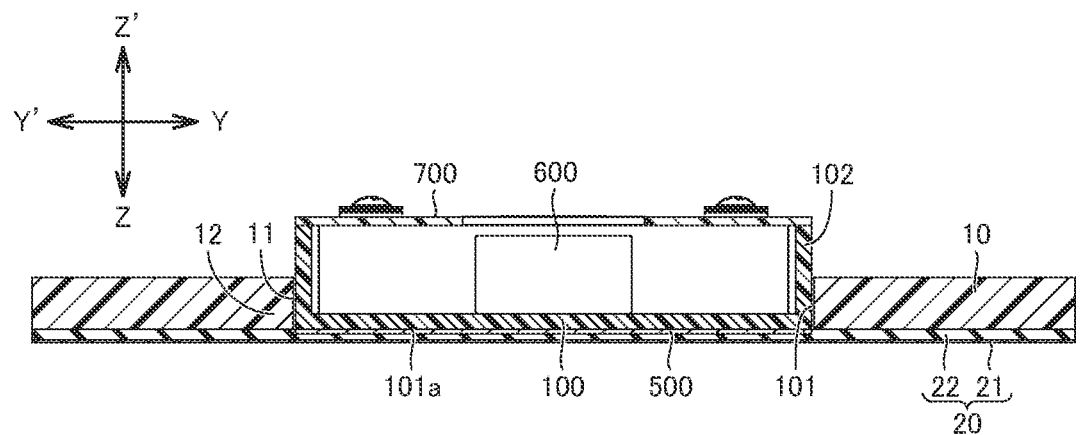
FIG. 2C is a cross-sectional view of the structure, taken along line 2C-2C in FIG. 1B.
Figure 2D:
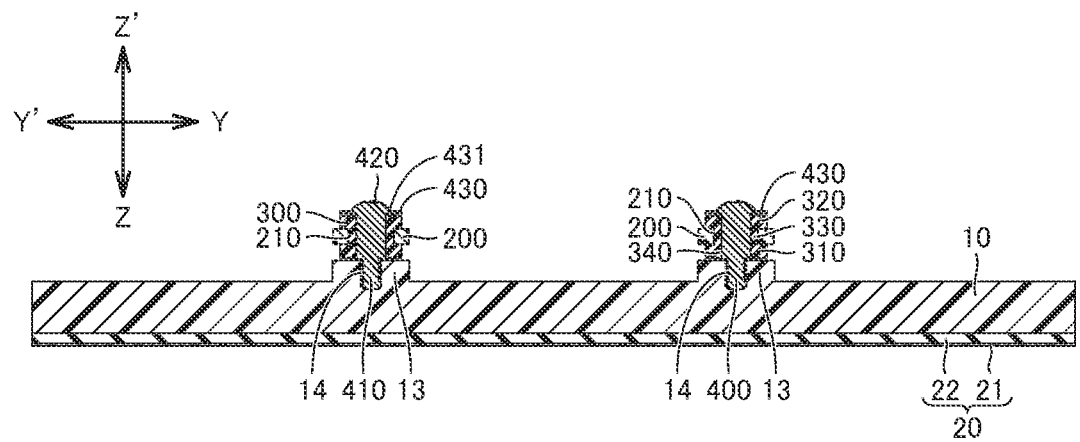
FIG. 2D is a cross-sectional view of the structure, taken along line 2D-2D in FIG. 1B.
Figure 3A:
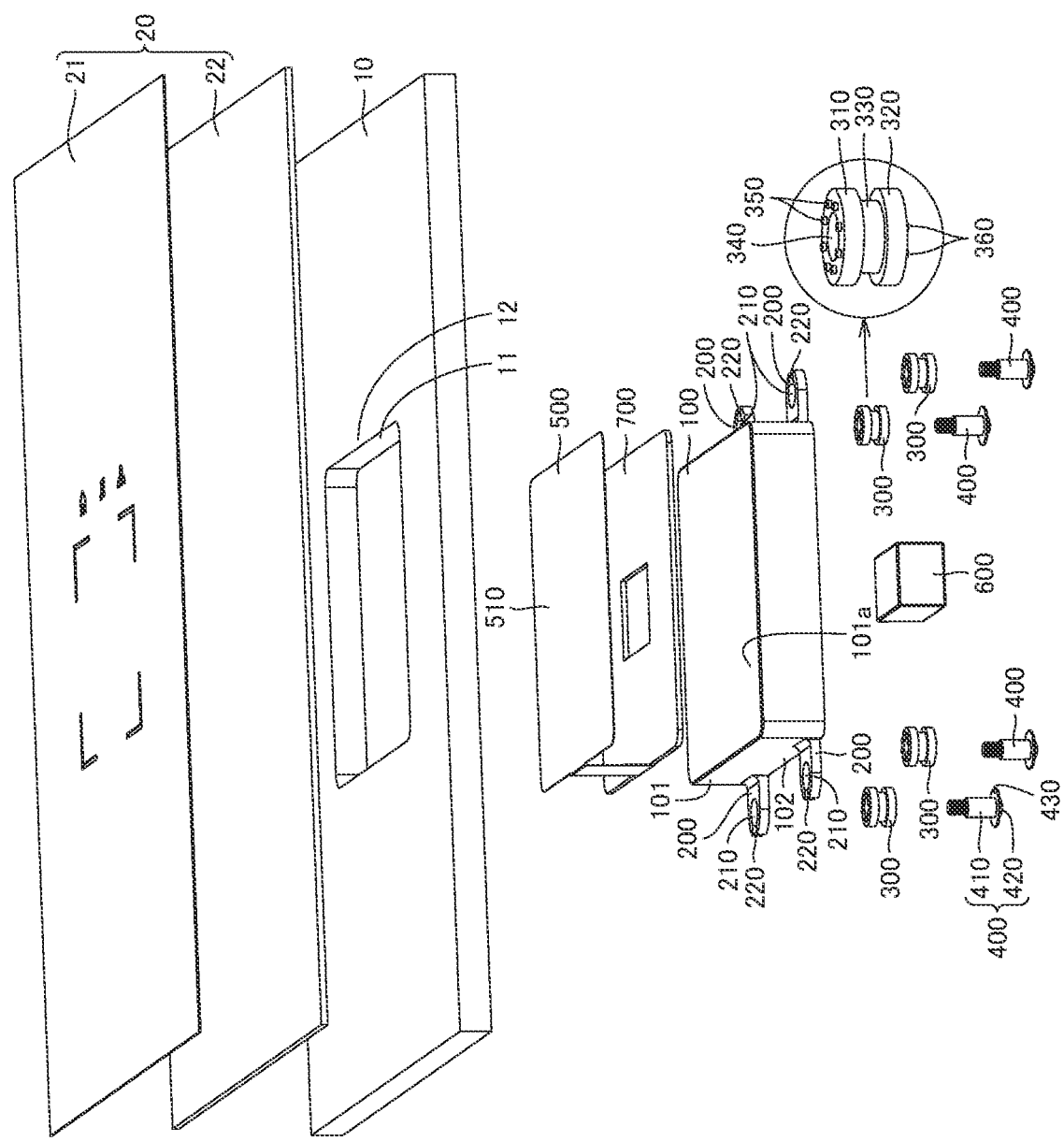
FIG. 3A is an enlarged and exploded, front, top, right side perspective view of the structure.
Figure 3B:
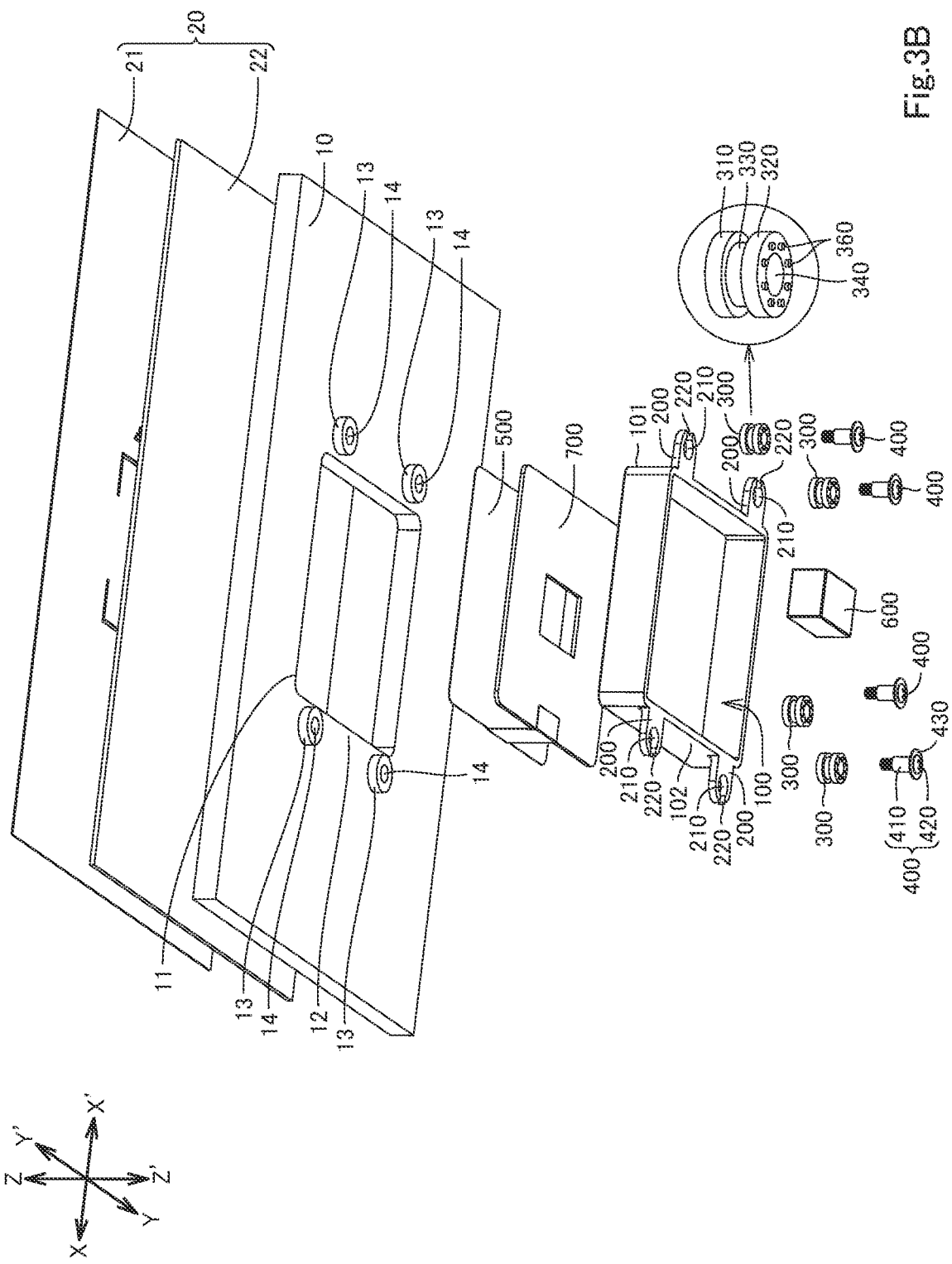
FIG. 3B is an enlarged and exploded front, bottom, right side perspective view of the structure.

In the brief description of the drawings above and the description of embodiments which follows, relative spatial terms such as "upper", "lower", "top", "bottom", "left", "right", "front", "rear", etc., are used for the convenience of the skilled reader and refer to the orientation of the sensor units, structures for attaching the sensor units, and their constituent parts as depicted in the drawings. No limitation is intended by use of these terms, either in use of the invention, during its manufacture, shipment, custody, or sale, or during assembly of its constituent parts or when incorporated into or combined with other apparatus.

DESCRIPTION OF EMBODIMENTS

Various embodiments of the invention, including first, second, and third embodiments and variants thereof, will now be described. Elements of the embodiments and the variants thereof to be described may be combined in any possible manner. Materials, shapes, dimensions, numbers, arrangements, etc. of the constituents of the various aspects of the embodiments and the variants thereof will be discussed below as examples only and may be modified as long as they achieve similar functions.

First Embodiment

Figure 4A:
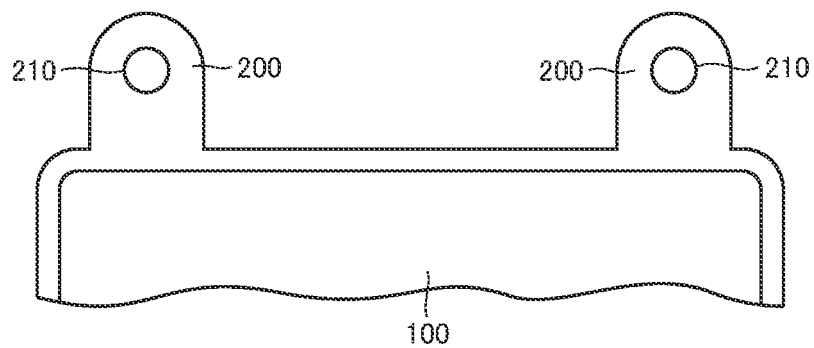
FIG. 4A is a schematic partial bottom view of a body and a fixable part of the sensor unit of first and second variants of the structure.
Figure 4B:
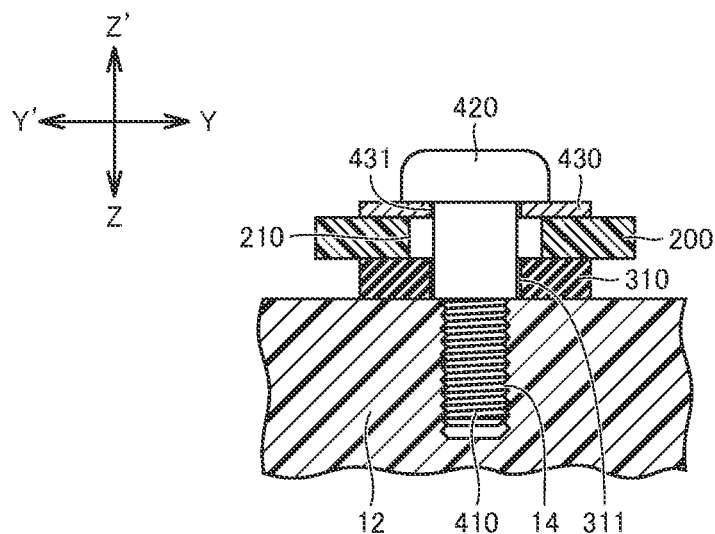
FIG. 4B is a partial cross-sectional view, corresponding to part of FIG. 2D, of the structure of the first variant.
Figure 4C:
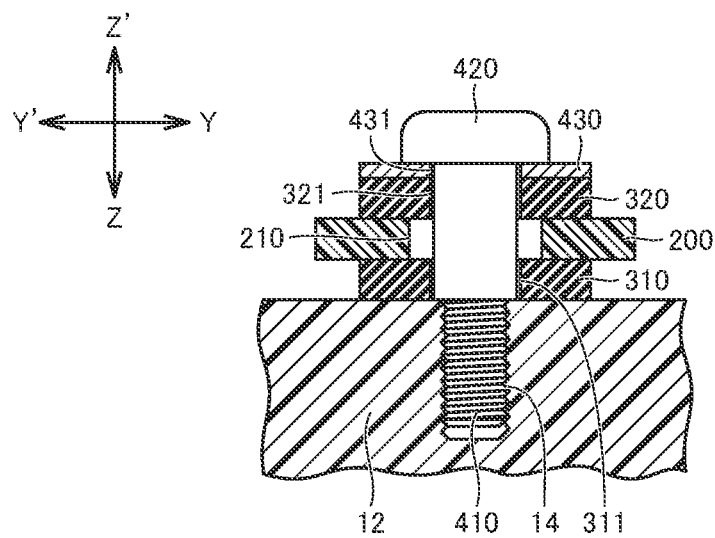
FIG. 4C is a partial cross-sectional view, corresponding to part of FIG. 2D, of the structure of the second variant.
Figure 5A:
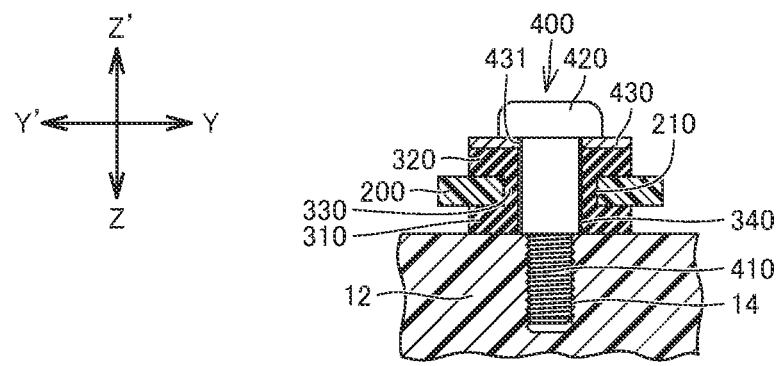
FIG. 5A is a partial cross-sectional view, corresponding to part of FIG. 2D, of a third variant of the structure.
Figure 5B:
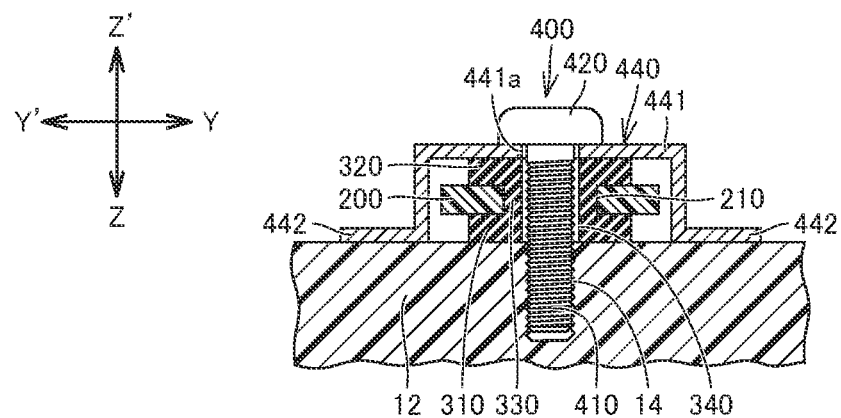
FIG. 5B is a partial cross-sectional view, corresponding to part of FIG. 2D, of a fourth variant of the structure.
Figure 5C:
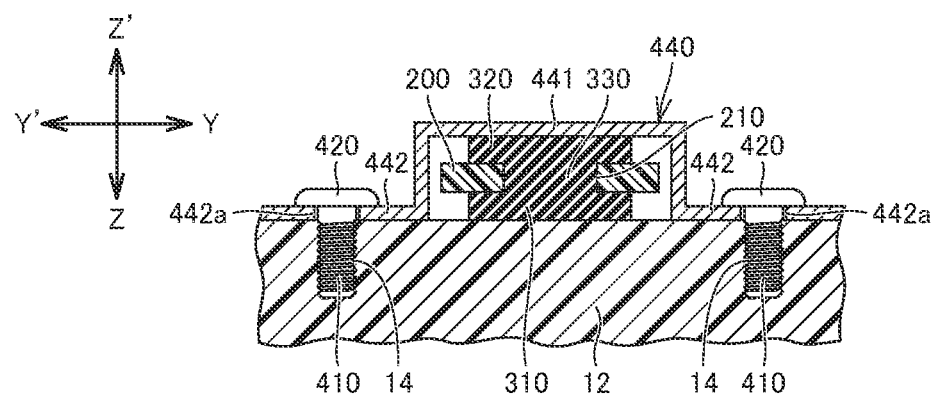
FIG. 5C is a partial cross-sectional view, corresponding to part of FIG. 2D, of a fifth variant of the structure.
Figure 6:
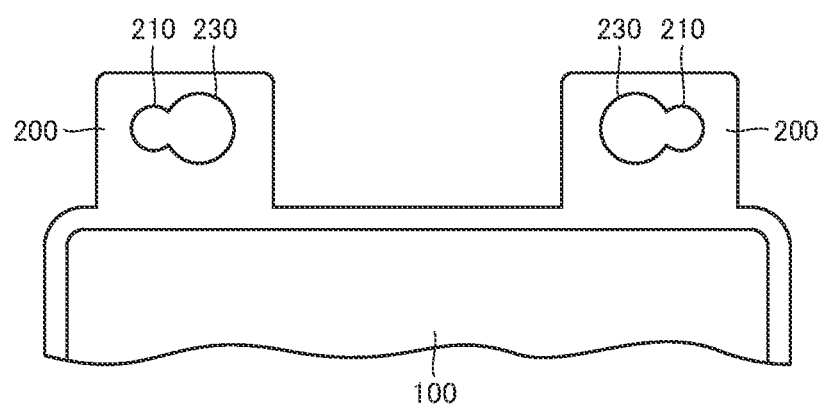
FIG. 6 is a schematic partial bottom view of a body and a fixable part of the sensor unit of a sixth variant of the structure.
Figure 7A:
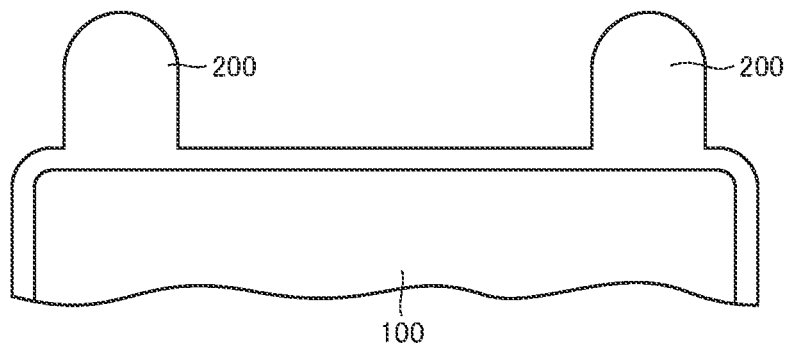
FIG. 7A is a schematic partial bottom view of a body and a fixable part of the sensor unit of a seventh variant of the structure.
Figure 7B:
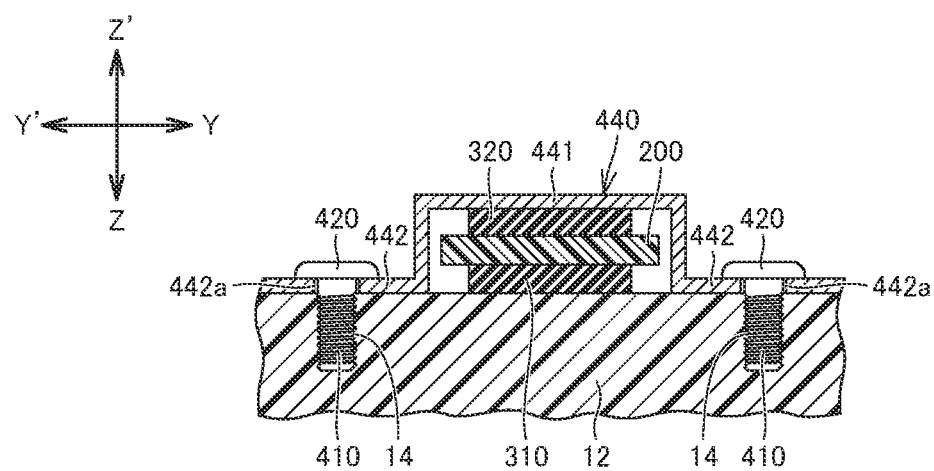
FIG. 7B is a partial cross-sectional view, corresponding to part of FIG. 2D, of the seventh variant of the structure.
Figure 8A:
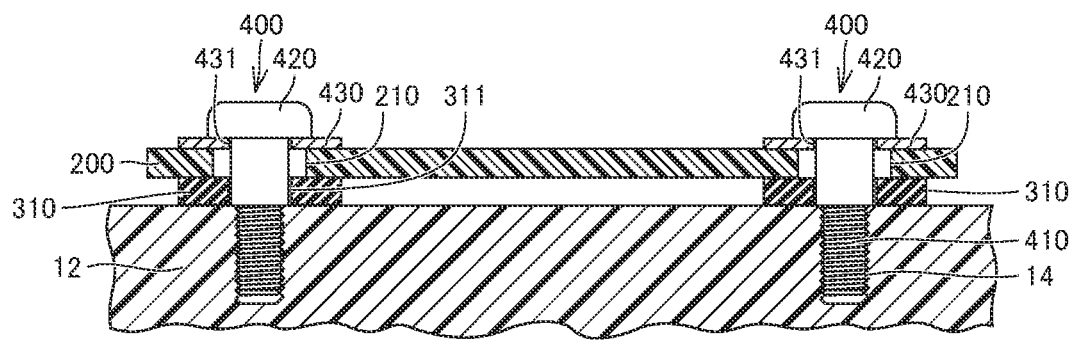
FIG. 8A is a partial cross-sectional view, corresponding to part of FIG. 2D, of an eighth variant of the structure.
Figure 8B:
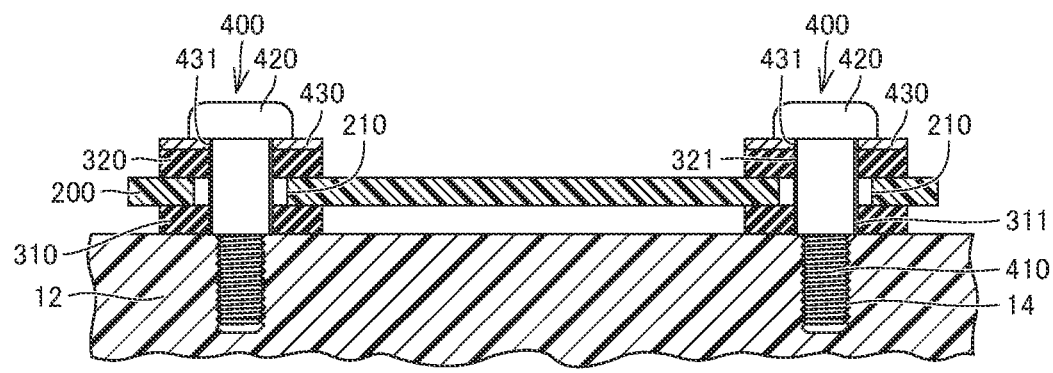
FIG. 8B is a partial cross-sectional view, corresponding to part of FIG. 2D, of a ninth variant of the structure.
Figure 8C:
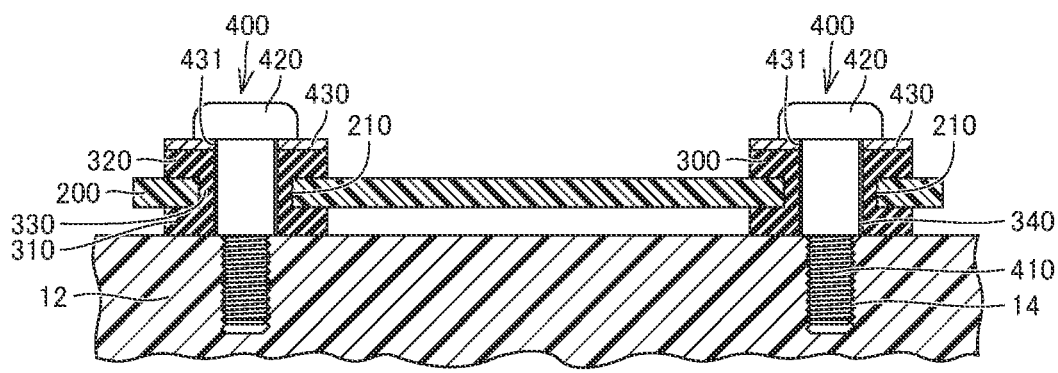
FIG. 8C is a partial cross-sectional view, corresponding to part of FIG. 2D, of a tenth variant of the structure.
Figure 8D:
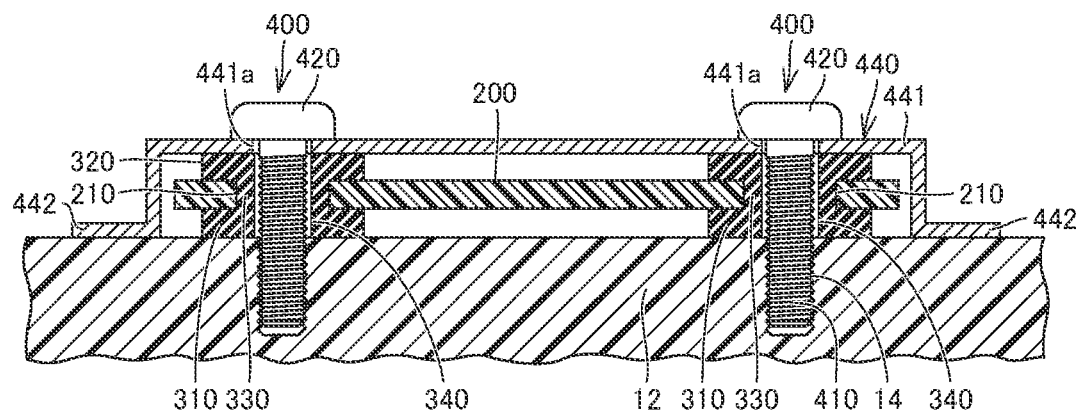
FIG. 8D is a partial cross-sectional view, corresponding to part of FIG. 2D, of an eleventh variant of the structure.
Figure 8E:
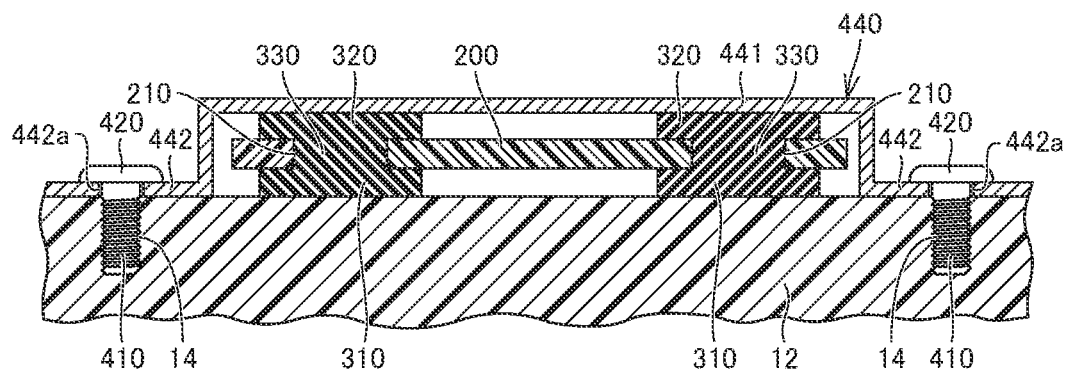
FIG. 8E is a partial cross-sectional view, corresponding to part of FIG. 2D, of a twelfth variant of the structure.
Figure 8F:
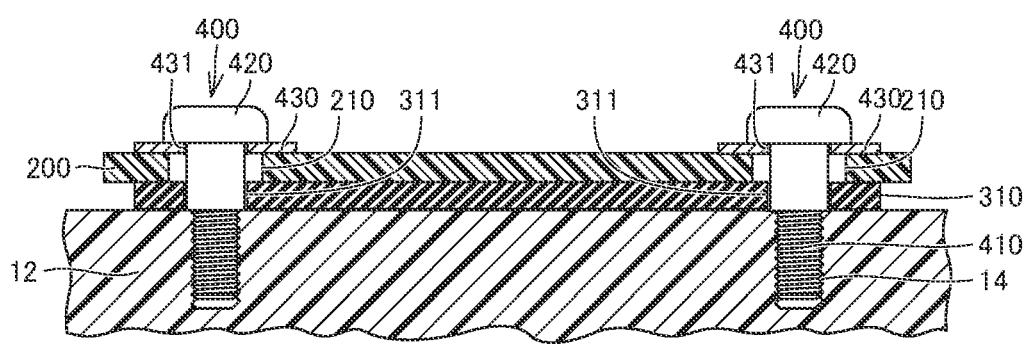
FIG. 8F is a partial cross-sectional view, corresponding to part of FIG. 2D, of a thirteenth variant of the structure.
Figure 8G:
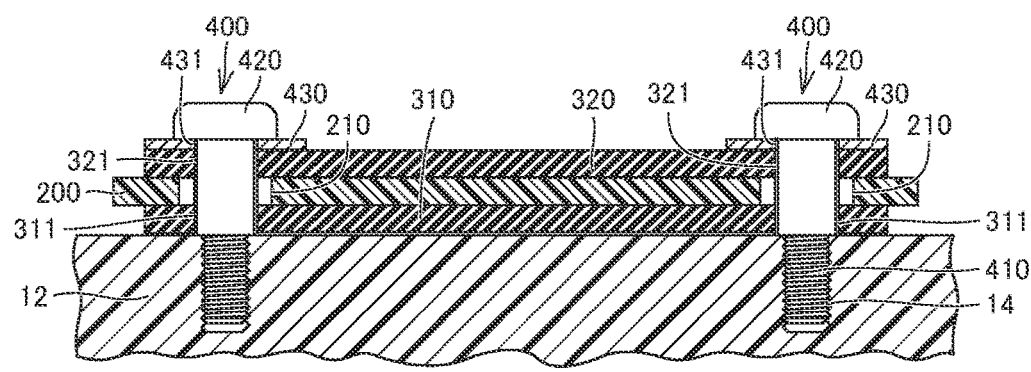
FIG. 8G is a partial cross-sectional view, corresponding to part of FIG. 2D illustrating a fourteenth variant of the structure.
Figure 8H:
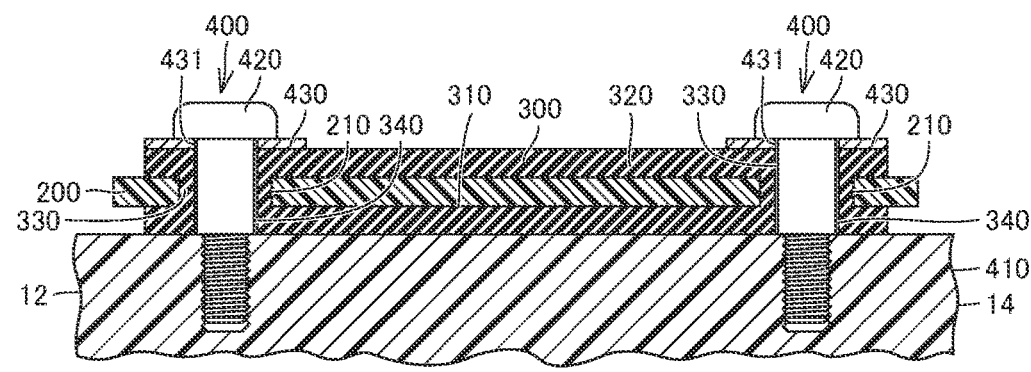
FIG. 8H is a partial cross-sectional view, corresponding to part of FIG. 2D, of a fifteenth variant of the structure.
Figure 8I:
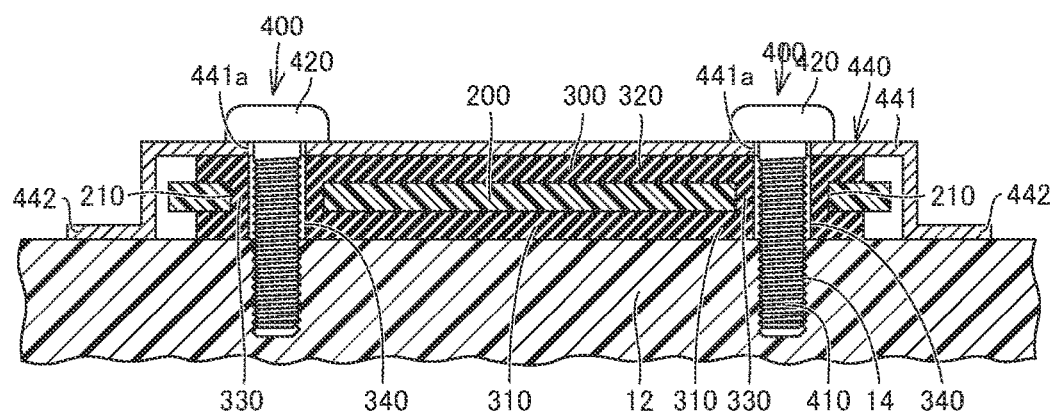
FIG. 8I is a partial cross-sectional view, corresponding to part of FIG. 2D, of a sixteenth variant of the structure.
Figure 8J:
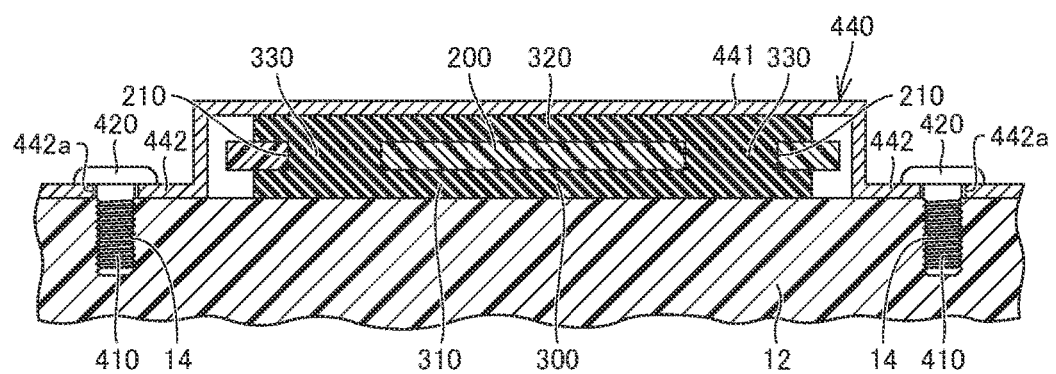
FIG. 8J is a partial cross-sectional view, corresponding to part of FIG. 2D, of a seventeenth variant of the structure.
Figure 9A:
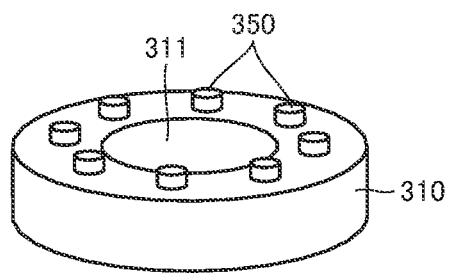
FIG. 9A is a perspective view of a first vibration damper of the sensor unit of another variant of the structure of the first, second, eighth, and ninth variants.
Figure 9B:
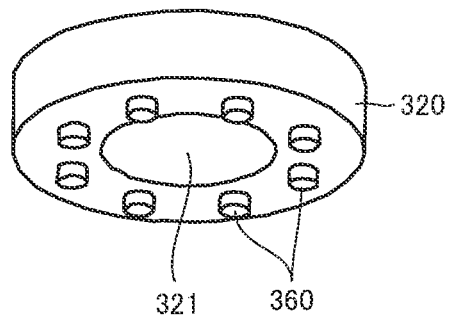
FIG. 9B is a perspective view of a second vibration damper of the sensor unit of another variant of the structure of the second and ninth variants.

Hereinafter described is a structure S1 for attaching a sensor unit U1 according to a plurality of embodiments, including a first embodiment and variants thereof, of the invention, with reference to FIGS. 1A to 9B. FIGS. 1A to 3B illustrate the structure S1 of the first embodiment. FIGS. 4A and 4B illustrate a first variant of the structure S1 of the first embodiment. FIGS. 4A and 4C illustrate a second variant of the structure S1 of the first embodiment. FIG. 5A illustrates a third variant of the structure S1 of the first embodiment. FIG. 5B illustrates a fourth variant of the structure S1 of the first embodiment. FIG. 5C illustrates a fifth variant of the structure S1 of the first embodiment. FIG. 6 illustrates a sixth variant of the structure S1 of the first embodiment. FIGS. 7A and 7B illustrate a seventh variant of the structure S1 of the first embodiment. FIGS. 8A, 8B, 8C, 8D, 8E, 8F, 8G, 8H, 8I, and 8J respectively illustrate eighth, ninth, tenth, eleventh, twelfth, thirteenth, fourteenth, fifteenth, sixteenth, and seventeenth variants of the structure S1 of the first embodiment. FIG. 9A illustrates another variant of the structure of the first, second, eighth, and ninth variants, and FIG. 9B illustrates another variant of the structure of the second and ninth variants.

FIGS. 1B to 3B and 5A to 6 indicate a Z-Z' direction (first direction). The Z-Z' direction includes a Z direction (one side in the first direction) and a Z' direction (the other side in the first direction). FIGS. 1B to 2B and 2E to 3B indicate an X-X' direction (second direction). The X-X' direction crosses the Z-Z' direction and may be substantially orthogonal to the Z-Z' direction (see FIGS. 2A to 2B and 2E to 3B). The X-X' direction includes an X direction (one side in the second direction) and an X' direction (the other side in the second direction). FIGS. 1B, 2C to 3B, and 5A to 6A indicate a Y-Y' direction (third direction). The Y-Y' direction crosses the Z-Z' and X-X' directions and is not located on the plane on which the Z-Z' and X-X' directions extend. The Y-Y' direction may be substantially orthogonal to the Z-Z' and X-X' directions (see FIGS. 1B, 2C to 3B, and 5A to 6A). The Y-Y' direction includes a Y direction (one side in the third direction) and a Y' direction (the other side in the third direction).

The structure S1 includes a housing 10, an overlay 20, and a sensor unit U1. The housing 10 may be, for example, an interior part of an automobile (e.g., a dashboard, a console, an inner panel of a door, or a headliner (lining)), a housing of a portable information terminal such as a smartphone, or a housing of a stationary information terminal to be operated by a user (e.g., an automated teller machine (ATM), a ticket vending device, a reception terminal for making a loan contract for cash advances or the like services, a multimedia terminal for making a ticket reservation and a product purchase application, a vending machine, a point of sales (POS) terminal, and a ticketing machine for issuing boarding passes and other tickets installed at an airport, a train station, and the like). The housing 10 has a face on the Z-direction side, which may be flat or at least partly curved. The housing 10 includes an accommodation hole 11 and a perimeter area 12 of the accommodation hole 11. The accommodation hole 11 is a polygonal or circular throughhole extending through the housing 10 in the Z-Z' direction. The Z-Z' direction may be referred to as an extending direction of the accommodation hole 11. It should be noted that FIGS. 1A to 6 illustrate the housing 10 only in part, not in whole. The perimeter area 12 have one of the following configurations (1) to (4).

(1) The perimeter area 12 includes a plurality of mounts 13 and a plurality of screw holes 14. The mounts 13 are circular- or polygonal-section columns extending in the Z' direction from the perimeter area 12, and are arranged around the accommodation holes 11 at spaced intervals. The screw holes 14 are provided in the corresponding mounts 13 and open in the Z' direction.

(2) The perimeter area 12 includes a plurality of screw holes 14. The screw holes 14 are provided in the perimeter area 12 and arranged around the accommodation hole 11 at spaced intervals. The screw holes 14 open in the Z' direction. In this case, the mounts 13 are omitted.

(3) The perimeter area 12 have configuration (1) with the screw holes 14 omitted. (4) The perimeter area 12 have configuration (2) with the screw holes 14 omitted.

The overlay 20 covers at least the accommodation hole 11 of the housing 10 from the Z-direction side. The overlay 20 may include at least one layer. The at least one layer includes a covering portion 21, which is the only or outermost one of the at least one layer. The covering portion 21 is constituted by, for example, a flexible material, a stretchable fiber material, and/or a molded synthetic resin. The flexible material may be an elastic material, such as an elastomer (e.g., urethane, polyvinyl chloride (PVC), thermoplastic polyolefins (TPO), or rubber). The stretchable fiber material may be a synthetic fiber containing polyurethane or a fiber material that is woven such as to have stretchability. The molded synthetic resin may be an elastomer or other moldable resin. The covering portion 21 includes an outermost face (a face on the Z-direction side of the overlay 20). The outermost face includes a touch region to be touched by a detection target, such as a finger of a user or a stylus. The outermost face of the covering portion 21 may also referred to as the outermost face of the overlay 20. The touch region may be any part of the outermost face, and may be a region including four L-shaped portions and three different icons as shown in FIG. 1A. The outermost face of the covering portion 21 (the outermost face of the overlay 20) may or may not be provided with protrusions and indentations formed irregularly (for example, protrusions and indentations formed by surface texturing to imitate a surface of natural leather (so-called leather grains)).

The at least one layer of the overlay 20 may further include a cushioning portion 22. The cushioning portion 22 may be constituted by a foaming material made of polypropylene (PP), polyethylene (PE), urethane, silicon, or the like; a gel material made of silicon, urethane, or the like; a fiber material formed by three-dimensionally weaving polyester or other synthetic fibers; or a soft resin material of an elastomer or the like. The cushioning portion 22 is arranged between the housing 10 and the covering portion 21, and closes the accommodation hole 11 of the housing 10 from the Z-direction side. The covering portion 21 and the cushioning portion 22 may further have one of the following configurations (5) to (7).

(5) The cushioning portion 22 has a shape and size, as viewed from the Z-direction side, that is substantially the same as a shape and size of the housing 10 (see FIGS. 1A to 2D). The cushioning portion 22 covers the housing 10 from the Z-direction side and closes the accommodation hole 11 from the Z-direction side. The cushioning portion 22 may be fixed to the housing 10 with an adhesive, a plurality of screws, a plurality of pins, and/or other means. The covering portion 21 has a shape and size, as viewed from the Z-direction side, that is substantially the same as a shape and size of the cushioning portion 22 (see FIGS. 1A to 2D). The covering portion 21 covers the cushioning portion 22 from the Z-direction side. The covering portion 21 may be fixed to the cushioning portion 22 and/or the housing 10 with an adhesive, or may be fixed to the housing 10 together with the cushioning portion 22 with an adhesive, a plurality of screws, a plurality of pins, and/or other means.

(6) The cushioning portion 22 has any suitable shape as viewed from the Z-direction side, and has a size, as viewed from the Z-direction side, that is larger than that of the accommodation hole 11 of the housing 10. The cushioning portion 22 covers the accommodation hole 11 and the perimeter area 12 of the housing 10 from the Z-direction side, and closes the accommodation hole 11 from the Z-direction side. The cushioning portion 22 may be fixed to the housing 10 in the same manner as in configuration (1) above. The covering portion 21 may have a shape and size, as viewed from the Z-direction side, that is substantially the same as the shape and size of the cushioning portion 22. In this case, the covering portion 21 covers only the cushioning portion 22 from the Z-direction side. The covering portion 21 may have any suitable shape as viewed from the Z-direction side, and has a size, as viewed from the Z-direction side, that is larger than that of the cushioning portion 22. In this case, the covering portion 21 covers the cushioning portion 22 and a part of the housing 10 that surrounds the cushioning portion 22 from the Z-direction side. The covering portion 21 may have a shape and size, as viewed from the Z-direction side, that is substantially the same as the shape and size of the housing 10. In this case, the covering portion 21 covers the cushioning portion 22 and the housing 10 from the Z-direction side. Of any of the above aspects, the covering portion 21 may be fixed to the cushioning portion 22 and/or the housing 10 in the same manner as in configuration (2) above.

(7) The cushioning portion 22 and the covering portion 21 each have a shape and size, as viewed from the Z-direction side, that is substantially the same as a shape and size of the accommodation hole 11 of the housing 10. The cushioning portion 22 closes the accommodation hole 11 from the Z-direction side. The covering portion 21 covers the cushioning portion 22 from the Z-direction side. The cushioning portion 22 and the covering portion 21 are supported by a body 100 and/or a detection sensor 500 (to be described) of the sensor unit U1.

The at least one layer of the overlay 20 may include one or more layers other than the covering portion 21 and the cushioning portion 22. The cushioning portion 22 can be omitted. Where the cushioning portion 22 is omitted, the covering portion 21 of any of the above aspects may close the accommodation hole 11 from the Z-direction side.

Where the cushioning portion 22 is omitted, the at least one layer of the overlay 20 may include one or more layers other than the covering portion 21.

The sensor unit U1 includes the body 100 made of an insulating resin, carbon, or metal. The body 100 is a tube with a bottom closing the Z-direction side of the body 100 (see FIGS. 1A to 3B), a plate (not illustrated), or a block (not illustrated). In any case, the body 100 includes a first portion 101 and a second portion 102 on the Z'-direction side relative to the first portion 101. The first portion 101 of the body 100 is accommodated in the accommodation hole 11 of the housing 10 from the Z'-direction side. For convenience of description, an "accommodation state" herein refers a state where the first portion 101 of the body 100 is accommodated in the accommodation hole 11 of the housing 10.

The first portion 101 of the body 100 includes a first face 101a on the Z-direction side. The first face 101a may be flat. The first face 101a may not be a flat face, in which case, the first face 101a in part or in whole may form a curved or spherical face bulging in the Z direction. With the first portion 101 accommodated in the accommodation hole 11 of the housing 10, the second portion 102 of the body 100 is located on the Z'-direction side relative to the accommodation hole 11. The body 100 may further have either configuration (A) or (B) as follows.

(A) The first portion 101 of the body 100 has a shape and size, as viewed from the Z-direction side, that is substantially the same as the shape and size of the accommodation hole 11 of the housing 10 (see FIGS. 1A to 3B). The first face 101a of the first portion 101 also has a shape and size, as viewed from the Z-direction side, that is substantially the same as the shape and size of the accommodation hole 11 of the housing 10 (see FIGS. 1A to 3B).

(B) The first portion 101 of the body 100 has any suitable shape as viewed from the Z-direction side, and has a size, as viewed from the Z-direction side, that is smaller than that of the accommodation hole 11 of the housing 10.

The body 100 includes a second face on the Z'-direction side. Where the body 100 is a tube with a bottom, the body 100 includes a bottom and a perimeter wall extending in the Z' direction from the bottom. In this case, the first portion 101 of the body 100 includes the bottom and a portion on the Z-direction side of the perimeter wall, and the second portion 102 of the body 100 includes a portion on the Z'-direction side of the perimeter wall. The face on the Z-direction side of the bottom forms the first face 101a, and the face of the bottom on the Z'-direction side of the body 100 forms the second face. Where the body 100 is a plate or block, the face of the bottom on the Z'-direction side of the body 100 forms the second face.

The sensor unit U1 further includes the detection sensor 500 provided at the body 100. The detection sensor 500 is configured to detect in the accommodation state that a detection target has contacted the touch region of the overlay 20 from the Z-direction side. It should be appreciated that the detection sensor 500 is illustrated in FIGS. 2A to 2D with an exaggerated dimension in the Z-Z' direction for convenience of description.

The detection sensor 500 may be, for example, a capacitive touch sensor, a resistive touch sensor, a pressure sensor, or the like. The detection sensor 500 is a flexible sheet shape or a rigid plate, and includes a first face 510 on the Z-direction side and a second face on the Z'-direction side. The detection sensor 500 may be fixed onto, and extend along, the first face 101a of the body 100. In this case, the second face of the detection sensor 500 abuts the first face 101a of the body 100 and may be fixed to the first face 101a of the body 100 with an adhesive or other means. The detection sensor 500 may further have any of the following configurations (C) and (D).

(C) The detection sensor 500 has a shape and size, as viewed from the Z-direction side, that is substantially the same as a shape and size of the first face 101a of the body 100 (see FIGS. 1A to 3B). Where the first portion 101 of the body 100 has a shape and size, as viewed from the Z-direction side, that is substantially the same as the shape and size of the accommodation hole 11 of the housing 10, the detection sensor 500 also has a shape and size, as viewed from the Z-direction side, that is substantially the same as the shape and size of the accommodation hole 11 of the housing 10.

(D) The detection sensor 500 has any suitable shape as viewed from the Z-direction side, and has any suitable shape as viewed from the Z-direction side as long as the detection sensor 500 can be placed on the first face 101a of the body 100. In other words, the detection sensor 500 has a size, as viewed from the Z-direction side, that is smaller than that of the accommodation hole 11 of the housing 10.

Where the body 100 has configuration (A) above and the detection sensor 500 has configuration (C) above, the detection sensor 500 and the body 100 may be arranged in the accommodation state such that the first face 101a of the body 100 is continuous with the face on the Z-direction side of the perimeter area 12 of the housing 10, or alternatively such that the first face 510 of the detection sensor 500 is continuous with the face on the Z-direction side of the perimeter area 12 of the housing 10e. Hereinafter, the former and latter arrangements may be referred to as a "first continuous arrangement" and a "second continuous arrangement," respectively. Where the first face 101a of the body 100 and the face on the Z-direction side of the perimeter area 12 of the housing 10 are flat, the first face 101a of the body 100 is flush and continuous with the face on the Z-direction side of the perimeter area 12 of the housing 10. This arrangement is also included in the first continuous arrangement. Where the first face 510 of the detection sensor 500 and the face on the Z-direction side of the perimeter area 12 of the housing 10 are flat, the first face 510 of the detection sensor 500 is flush and continuous with the face on the Z-direction side of the perimeter area 12 of the housing 10. This arrangement is also included in the second continuous arrangement. Where the detection sensor 500 and the body 100 are in the first continuous arrangement, the detection sensor 500 abuts the overlay 20 from the Z'-direction side. Where the cushioning portion 22 is provided, the cushioning portion 22 is recessed conforming to the shape of the detection sensor 500 and conforming to the thickness in the Z-Z' direction of the detection sensor 500. Where the detection sensor 500 and the body 100 are in the second continuous arrangement, the detection sensor 500 abuts the overlay 20 from the Z'-direction side.

Where the body 100 has configuration (B) above and the detection sensor 500 has configuration (C) above, the detection sensor 500 and the body 100 may be arranged such that the first face 101a of the body 100 is located substantially at the same height in the Z-Z' direction as the face on the Z-direction side of the perimeter area 12 of the housing 10, or alternatively the detection sensor 500 and the body 100 may be arranged in the second continuous arrangement. In the former case, the detection sensor 500 abuts the overlay 20 from the Z'-direction side; and where the cushioning portion 22 is provided, the cushioning portion 22 is recessed conforming to the shape of the detection sensor 500 and conforming to the thickness in the Z-Z' direction of the detection sensor 500. In the latter case, the detection sensor 500 abuts the overlay 20 from the Z'-direction side.

Where the body 100 has configuration (A) above and the detection sensor 500 has configuration (D) above, the detection sensor 500 and the body 100 may be in the second continuous arrangement, or alternatively the detection sensor 500 and the body 100 may be arranged such that the first face 510 of the detection sensor 500 is located substantially at the same height in the Z-Z' direction as the face on the Z-direction side of the perimeter area 12 of the housing 10. In the former case, the detection sensor 500 and the body 100 abut the overlay 20 from the Z'-direction side; and where the cushioning portion 22 is provided, the cushioning portion 22 is recessed conforming to the shape of the detection sensor 500 and conforming to the thickness in the Z-Z' direction of the detection sensor 500. In the latter case, the detection sensor 500 and the body 100 abut the overlay 20 from the Z'-direction side.

When the body 100 has configuration (B) above and the detection sensor 500 has configuration (D) above, the detection sensor 500 and the body 100 may be arranged such that the first face 101a of the body 100 is located substantially at the same height in the Z-Z' direction as the face on the Z-direction side of the perimeter area 12 of the housing 10, or alternatively such that the first face 510 of the detection sensor 500 is located substantially at the same height in the Z-Z' direction as the face on the Z-direction side of the perimeter area 12 of the housing 10 on the Z-direction side. In the former case, the detection sensor 500 and the body 100 abut the overlay 20 from the Z'-direction side; and where the cushioning portion 22 is provided, the cushioning portion 22 is recessed conforming to the shape of the detection sensor 500 and conforming to the thickness in the Z-Z' direction of the detection sensor 500. In the latter case, the detection sensor 500 and the body 100 abut the overlay 20 from the Z'-direction side.

The detection sensor 500 may be fixed onto, and extend along, the second face of the body 100, or alternatively may be embedded in the body 100. In either of these aspects, the body 100 may have configuration (A) above and be in the first continuous arrangement, or alternatively the body 100 may have configuration (B) above and the detection sensor 500 and the body 100 may be arranged such that the first face 101a of the body 100 is located substantially at the same height in the Z-Z' direction as the face on the Z-direction side of the perimeter area 12 of the housing 10. In any arrangement, the first face 101a of the body 100 abuts the overlay 20 from the Z'-direction side.

Where the detection sensor 500 is a capacitive touch sensor, the capacitive touch sensor may be a self-capacitive touch sensor or a mutual-capacitive touch sensor, or serve as a dual-purpose self-capacitive and mutual-capacitive touch sensor.

Where the capacitive touch sensor is a self-capacitive touch sensor, the touch sensor includes one or a plurality of electrodes and may be configured as follows. In the accommodation state, when a detection target comes into contact with the outermost face of the overlay 20 while the one or plurality of electrodes are electrically charged and then discharged, this contact causes a change in a capacitance between the one or plurality of electrodes and the detection target so as to change a signal or signals (e.g., a voltage) of the one or plurality of electrodes.

Where the capacitive touch sensor is a mutual-capacitive touch sensor, the touch sensor includes at least one drive electrode and at least one detection electrode and may be configured as follows. In the accommodation state, when a detection target comes into contact with the outermost face of the overlay 20 while a drive pulse is applied to the at least one drive electrode and the at least one drive electrode is electrostatically coupled to the at least one detection electrode, this contact causes a change in a capacitance between the at least one drive electrode and the at least one detection electrode so as to change at least one signal (e.g., a voltage) of the at least one detection electrode.

Where the capacitive touch sensor serves as a dual-purpose self-capacitive and mutual-capacitive touch sensor, the touch sensor includes at least one drive electrode and at least one detection electrode and may be configured as follows. In the accommodation state, when a detection target comes into contact with the outermost face of the overlay 20 while the at least one detection electrode is electrically charged and then discharged, this contact causes a change in a capacitance between the at least one detection electrode and the detection target so as to change at least one signal (e.g., a voltage) of the at least one detection electrode. Also, in the accommodation state, when a detection target comes into contact with the outermost face of the overlay 20 while a drive pulse is applied to the at least one drive electrode and the at least one drive electrode is electrostatically coupled to the at least one detection electrode, this contact causes a change in a capacitance between the at least one drive electrode and the at least one detection electrode so as to change at least one signal (e.g., a voltage) of the at least one detection electrode.

Where the detection sensor 500 is a resistive touch sensor, the touch sensor includes at least one set of electrically-resistive films, and the or each set includes two resistive films. The electrically-resistive films of the or each set face each other with a clearance therebetween. In the accommodation state, when a detection target comes into contact with the outermost face of the overlay 20 while a voltage is applied to one of the electrically-resistive films of the or each set, the electrically-resistive film comes into contact with the other electrically-resistive film of the or each set so as to change a signal (e.g., a voltage) of the other electrically-resistive film.

Where the detection sensor 500 is a pressure sensor, the detection sensor 500 may be configured as follows. In the accommodation state, when a detection target comes into contact with the outermost face of the overlay 20, this contact causes a change in a signal (e.g., a voltage) of the pressure sensor.

It should be noted that the detection sensor 500 is not limited to a capacitive touch sensor, a resistive touch sensor, a pressure sensor, or the like. The detection sensor 500 may be an ultrasonic surface acoustic wave touch sensor, an optical touch sensor, an inductive touch sensor, etc. In this case, the body 100 and/or the detection sensor 500 abut the overlay 20 from the Z'-direction side. The detection sensor 500 and the body 100 may or may not be in the first continuous arrangement.

The sensor unit U1 further includes a vibration generator 600. The vibration generator 600 is configured to vibrate the body 100 and the detection sensor 500 and thereby provide a tactile feedback to the detection target via the overlay 20 when a detection target comes into contact with the overlay 20. For example, the vibration generator 600 may be configured to vibrate a vibratable unit in a frequency band between 150 Hz to 200 Hz. Vibration in this frequency band may be, but is not required to be, easy to sense but difficult to hear to humans. The vibration generator 600 may be constituted by a linear resonant actuator (LRA), a voice coil motor (VCM), an eccentric rotating mass motor (ERM), a solenoid, a piezoelectric element, or other vibrating element. The vibration generator 600 may be configured to apply vibration to the body 100 in the Z-Z' direction, or in a direction other than the Z-Z' direction.

The vibration generator 600 may be fixed to the body 100, or to a support (not illustrated) located on the Z-Z'-direction side relative to the body 100. Where the body 100 is a tube with a bottom, the vibration generator 600 is fixed to, and accommodated in, the body 100. The vibration generator 600 may be fixed to the second face of the bottom of the body 100 and accommodated in the body 100 as shown in FIGS. 1B to 2E.

The sensor unit U1 further includes a plurality of fixable parts 200 and a plurality of vibration dampers 300. The plurality of vibration dampers 300 is constituted by elastic substance—for example, a rubber material such as silicon and EPDM, or a gel material such as urethane and silicon. For convenience of description and differentiation, all of the plurality of vibration dampers 300 may be referred to as the "all vibration dampers 300," some of the all vibration dampers 300 may be referred to as "some vibration dampers 300," and one of the all vibration dampers 300 may be referred to as "one vibration damper 300."

The plurality of fixable parts 200 is provided on the second portion 102 of the body 100. The fixable parts 200 may be constituted by, for example, flanges or protrusions extending from the second portion 102 in a direction crossing the Z-Z' direction. The plurality of fixable parts 200 includes at least one set of fixable parts 200, and the or each set includes two fixable parts 200. The fixable parts 200 of the or each set may extend from the second portion 102 in respective directions that cross the Z-Z' direction and are opposite to each other (these directions may be e.g., the X and X' directions (see FIGS. 1A to 4B), or the Y and Y' directions). Obviously, the fixable parts 200 may include a plurality of sets of fixable parts 200. Alternatively, three or more fixable parts 200 may extend from the second portion 102 in radial directions that cross the Z-Z' direction.

The plurality of fixable parts 200 may be integral and contiguous with the second portion 102 of the body 100. Alternatively, the plurality of fixable parts 200 may be separately provided from the second portion 102 of the body 100 and fixed to the second portion 102, e.g., fitted in or screwed to fitting holes or the like of the second portion 102 of the body 100.

In another aspect, the plurality of fixable parts 200 may be end portions, in a direction or directions that cross the Z-Z' direction, of the second portion 102 of the body 100. In this case, the second portion 102 of the body 100 is larger than the first portion 101 of the body 100 in the directions crossing the Z-Z' direction. The plurality of fixable parts 200 of this aspect include at least one sets of fixable parts 200, and the or each set includes two fixable parts 200. The fixable parts 200 of the or each set may respectively be first and second end portions, in respective directions that are opposite to each other and cross the Z-Z' direction, of the second portion 102 of the body 100 (the first and second end portions may be e.g., first and second end portions in the X and X' directions, respectively, or second end portions in the Y and Y' directions, respectively.) Obviously, the plurality of fixable parts 200 may include a plurality of sets of fixable parts 200, and may include three or more sets of fixable parts 200.

In any aspect, each of the fixable parts 200 may be arranged on the Z'-direction side relative to the perimeter area 12 of the housing 10 and fixed to the perimeter area 12 of the housing 10 from the Z'-direction side via a corresponding one vibration damper 300 in the accommodation state. This fixing state may also be referred to as a first fixing state. In this case, each corresponding vibration damper 300 is at least partly interposed between each fixable part 200 and the housing 10. Each of the fixable parts 200 may be arranged on the Z'-direction side relative to the perimeter area 12 of the housing 10 and fixed to the perimeter area 12 of the housing 10 from the Z'-direction side via corresponding some vibration dampers 300 in the accommodation state. This fixing state may also be referred to as a second fixing state. In this case, the corresponding some vibration dampers 300 are at least partly interposed between each fixable part 200 and the housing 10.

The sensor unit U1 may further include a plurality of fixing parts. For convenience of description and differentiation, all of the plurality of fixing parts may be referred to as the "all fixing parts," and some of the all fixing parts may be referred to as the "some fixing parts," and one of the all fixing parts may be referred to as the "one fixing part" in a distinguishable manner. Where the fixing parts are provided, each one fixing part may be configured to fix a corresponding one fixable part 200 to the perimeter area 12 of the housing 10 from the Z'-direction side via a corresponding one vibration damper 300 in the first fixing state. Alternatively, each set of some fixing parts or each one fixing part may be configured to fix a corresponding one fixable part 200 to the perimeter area 12 of the housing 10 from the Z'-direction side via corresponding some vibration dampers 300 in the second fixing state.

Where the fixable parts 200, the vibration dampers 300, and the fixing parts are provided in a one-to-one-to-one relationship, each of the fixable parts 200, a corresponding one of the vibration dampers 300, and a corresponding one of fixing parts may further have any of the configurations (a) to (g) described below. For convenience of description, configurations (a) to (g) will be described referring to one of the fixable parts 200, a corresponding one of the vibration dampers 300, and a corresponding one of the fixing parts, but each configuration can apply to the plurality of fixable parts 200, the plurality of vibration dampers 300, and the plurality of fixing parts.

(a) The fixable part 200 includes an attaching hole 210 (see FIG. 4A). The attaching hole 210 extends in the Z-Z' direction through the fixable part 200. The vibration damper 300 includes a first vibration damper 310 constituted by the elastic substance described above (see FIG. 4B). The first vibration damper 310 includes a through-hole 311. The through-hole 311 extends in the Z-Z' direction through the first vibration damper 310. The fixing part includes a screw 400 and a washer 430 (see FIG. 4B). The washer 430 includes a through-hole 431. The through-hole 431 extends in the Z-Z' direction through the washer 430. The screw 400 includes a screw body 410 and a head 420. The screw body 410 has an outer diameter that is smaller than the cross-sectional diameter in the X-X' direction of each of the through-hole 311, the attaching hole 210, and the through-hole 431. In the first fixing state, the head 420 of the screw 400, the washer 430, the fixable part 200, the first vibration damper 310, and the perimeter area 12 of the housing 10 are arranged in this order from the Z'-direction side; the through-hole 431 of the washer 430 communicates with the attaching hole 210 of the fixable part 200; and the through-hole 311 of the first vibration damper 310 communicates with the attaching hole 210 of the fixable part 200 and a corresponding one of the screw holes 14; and the screw body 410 of the screw 400 is sequentially received in the through-hole 431 of the washer 430, the attaching hole 210 of the fixable part 200, and the through-hole 311 of the first vibration damper 310 and screwed in the corresponding screw hole 14. Where the perimeter area 12 of the housing 10 has configuration (1) above, the first vibration damper 310 is interposed between a corresponding one of the mounts 13 and the fixable part 200, and the washer 430 is interposed between the head 420 of the screw 400 and the fixable part 200. Where the perimeter area 12 of the housing 10 has configuration (2) above, the first vibration damper 310 is interposed between the perimeter area 12 of the housing 10 and the fixable part 200, and the washer 430 is interposed between the head 420 of the screw 400 and the fixable part 200. The washer 430 can be omitted. Where the washer 430 is omitted, the head 420 of the screw 400 abuts the fixable part 200.

Configuration (a) may be provided without the fixing part. In this case, the fixable part 200 and the vibration damper 300 is similar to those of configuration (a) above but different in the following points. The fixable part 200 is a plate without the attaching hole 210. The first vibration damper 310 of the vibration damper 300 is provided without the through-hole 311. The fixable part 200 is bonded to the first vibration damper 310, and the first vibration damper 310 is bonded to the perimeter area 12 of the housing 10, so that the fixable part 200 is fixed to the perimeter area 12 of the housing 10 via the first vibration damper 310.

(b) The fixable part 200, the vibration damper 300, and the fixing part are similar to those of configuration (a) above but different in that the vibration damper 300 further includes a second vibration damper 320 provided separately from the first vibration damper 310 (see FIG. 4C). This difference will be solely described below in connection with configuration (b). The second vibration damper 320 is constituted by the elastic substance described above. The second vibration damper 320 includes a through-hole 321. The through-hole 321 extends in the Z-Z' direction through the second vibration damper 320. The screw body 410 has an outer diameter that is smaller than the diameter of each of the through-hole 311 of the first vibration damper 310, the attaching hole 210 of the fixable part 200, the through-hole 321 of the second vibration damper 320, and the through-hole 431 of the washer 430. In the first fixing state, the head 420 of the screw 400, the washer 430, the second vibration damper 320, the fixable part 200, the first vibration damper 310, and the perimeter area 12 of the housing 10 are arranged in this order from the Z'-direction side; the through-hole 321 of the second vibration damper 320 communicates with the attaching hole 210 of the fixable part 200 and the through-hole 431 of the washer 430; the through-hole 311 of the first vibration damper 310 communicates with the attaching hole 210 of the fixable part 200 and a corresponding one of the screw holes 14; and the screw body 410 of the screw 400 is sequentially received in the through-hole 431 of the washer 430, the through-hole 321 of the second vibration damper 320, the attaching hole 210 of the fixable part 200, and the through-hole 311 of the first vibration damper 310 and screwed in the corresponding screw holes 14. Where the perimeter area 12 of the housing 10 has configuration (1) above, the first vibration damper 310 is interposed between a corresponding one of the mounts 13 and the fixable part 200, the second vibration damper 320 is interposed between the fixable part 200 and the washer 430 (abuttable portion), and the washer 430 is interposed between the head 420 of the screw 400 and the second vibration damper 320. Where the perimeter area 12 of the housing 10 has configuration (2) above, the first vibration damper 310 is interposed between the perimeter area 12 of the housing 10 and the fixable part 200, the second vibration damper 320 is interposed between the fixable part 200 and the washer 430 (abuttable portion), and the washer 430 is interposed between the head 420 of the screw 400 and the second vibration damper 320. The washer 430 can be omitted. Where the washer 430 is omitted, the second vibration damper 320 is interposed between the fixable part 200 and the head 420 (abuttable portion).

(c) The fixable part 200, the vibration damper 300, and the fixing part are similar to those of configuration (b) above but different in that the fixable part 200 further includes a cutout 220 (see FIGS. 3A and 3B), and that the vibration damper 300 further includes a coupling portion 330 and a through-hole 340. (see FIG. 5A). These differences will be solely described below in connection with configuration (c). The coupling portion 330 couples between the first vibration damper 310 and the second vibration damper 320. The coupling portion 330 has a cross-sectional outer dimension in the X-X' direction that is than that of each of the first vibration damper 310 and the second vibration damper 320. The through-hole 311 of the first vibration damper 310 and the through-hole 321 of the second vibration damper 320 are replaced with the through-hole 340 extending in the Z-Z' direction through the first vibration damper 310, the second vibration damper 320, and the coupling portion 330. The screw body 410 has an outer diameter that is smaller than the diameter of each of the through-hole 340 of the vibration damper 300 and the through-hole 431 of the washer 430. The attaching hole 210 has a diameter that is substantially the same as, or slightly smaller than, the outer diameter of the coupling portion 330. The cutout 220 communicates with the attaching hole 210 and is open to the outer side of the corresponding fixable part 200. The cutout 220 has a widthwise dimension that is smaller than the diameter of the attaching hole 210, and the widthwise dimension is such as to allow the coupling portion 330 to be pushed into the attaching hole 210 through the cutout 220. The coupling portion 330 fits in the attaching hole 210. In the first fixing state, the head 420 of the screw 400, the washer 430, the vibration damper 300, and the perimeter area 12 of the housing 10 are arranged in this order from the Z'-direction side; the second vibration damper 320 is interposed between the fixable part 200 and the washer 430; the first vibration damper 310 is interposed between the fixable part 200 and the perimeter area 12 of the housing 10; the through-hole 340 of the vibration damper 300 communicates with the through-hole 431 of the washer 430 and a corresponding one of the screw holes 14, the screw body 410 of the screw 400 is sequentially received in the through-hole 431 of the washer 430 and the through-hole 340 of the vibration damper 300 and screwed in the corresponding screw hole 14. Where the perimeter area 12 of the housing 10 has configuration (1) above, the first vibration damper 310 is interposed between a corresponding one of the mounts 13 and the fixable part 200, the second vibration damper 320 is interposed between the fixable part 200 and the washer 430 (abuttable portion), and the washer 430 is interposed between the head 420 of the screw 400 and the second vibration damper 320. Where the perimeter area 12 of the housing 10 has configuration (2) above, the first vibration damper 310 is interposed between the perimeter area 12 of the housing 10 and the fixable part 200, the second vibration damper 320 is interposed between the fixable part 200 and the washer 430 (abuttable portion), and the washer 430 is interposed between the head 420 of the screw 400 and the second vibration damper 320. Where the washer 430 is omitted, the second vibration damper 320 is interposed between the fixable part 200 and the head 420 (abuttable portion).

(d) The fixable part 200, the vibration damper 300, and the fixing part are similar to those of configuration (c) above but different in that the fixing part includes a fastener 440 (see FIG. 5B) instead of the washer 430. This difference will be solely described below in connection with configuration (d). The fastener 440 includes an abuttable portion 441 and a pair of generally L-shaped legs 442. The abuttable portion 441 is a flat plate and includes a through-hole 441a. The through-hole 441a extends in the Z-Z' direction through the abuttable portion 441. The screw body 410 has an outer diameter that is smaller than the diameter of each of the through-hole 340 of the vibration damper 300 and the through-hole 441a of the fastener 440. The legs 442 each include first and second legs. The first legs of the legs 442 extend in the Z direction from opposite ends of the abuttable portion 441. The second legs of the legs 442 extend in opposite directions from, and at substantially right angles, to respective ends in the Z-direction of the first legs. In the first fixing state, the head 420 of the screw 400, the abuttable portion 441 of the fastener 440, the vibration damper 300, and the perimeter area 12 of the housing 10 are arranged in this order from the Z'-direction side; the second legs of the fastener 440 abut the perimeter area 12 of the housing 10; the second vibration damper 320 is interposed between the fixable part 200 and the abuttable portion 441, the first vibration damper 310 is interposed between the fixable part 200 and the perimeter area 12 of the housing 10; the through-hole 340 of the vibration damper 300 communicates with the through-hole 441a of the abuttable portion 441 and a corresponding one of the screw holes 14; and the screw body 410 is sequentially received in the through-hole 441a of the fastener 440 and the through-hole 340 of the vibration damper 300 and screwed in screwed in the corresponding screw hole 14. Where the perimeter area 12 of the housing 10 has configuration (1) above, the first vibration damper 310 is interposed between a corresponding one of the mounts 13 and the fixable part 200, the second vibration damper 320 is interposed between the fixable part 200 and the abuttable portion 441 of the fastener 440, and the abuttable portion 441 of the fastener 440 is interposed between the head 420 of the screw 400 and the second vibration damper 320. Where the perimeter area 12 of the housing 10 has configuration (2) above, the first vibration damper 310 is interposed between the perimeter area 12 of the housing 10 and the fixable part 200, the second vibration damper 320 is interposed between the fixable part 200 and the abuttable portion 441 of the fastener 440, and the abuttable portion 441 of the fastener 440 is interposed between the head 420 of the screw 400 and the second vibration damper 320. In any aspect, where the distance in the Z-Z' direction between the abuttable portion 441 and the perimeter area 12 is slightly smaller than a dimension in the Z-Z' direction of the vibration damper 300, the vibration damper 300 is compressed between the abuttable portion 441 and the perimeter area 12 of the housing 10.

(e) The fixable part 200, the vibration damper 300, and the fixing part are similar to those of configuration (d) above but different in that the fixing part includes a plurality of screws 400, that the fastener 440 is provided with a plurality of through-holes 442a instead of the through-hole 441a, and that the vibration damper 300 is not provided with the through-hole 340 (see FIG. 5C). These differences will be solely described below in connection with configuration (e). Each of second legs of the legs 442 of the fastener 440 is provided with at least one through-hole 442a. Each of the screw bodies 410 of the screws 400 has an outer diameter that is smaller than the diameter of a corresponding one of the through-holes 442a of the fastener 440. In the first fixing state, the abuttable portion 441 of the fastener 440, the vibration damper 300, and the perimeter area 12 of the housing 10 are arranged in this order from the Z'-direction side; the second legs abut the perimeter area 12 of the housing 10; the second vibration damper 320 is interposed between the fixable part 200 and the abuttable portion 441; the first vibration damper 310 is interposed between the fixable part 200 and the perimeter area 12 of the housing 10; the through-holes 442a communicate with the corresponding screw holes 14 in the perimeter area 12 of the housing 10; the screw bodies 410 are received in the corresponding through-holes 442a of the fastener 440 and are screwed in the corresponding screw holes 14. Where the perimeter area 12 of the housing 10 has configuration (1) above, the first vibration damper 310 is interposed between a corresponding one of the mounts 13 and the fixable part 200, and the second vibration damper 320 is interposed between the fixable part 200 and the abuttable portion 441 of the fastener 440. Where the perimeter area 12 of the housing 10 has configuration (2) above, the first vibration damper 310 is interposed between the perimeter area 12 of the housing 10 and the fixable part 200, and the second vibration damper 320 is interposed between the fixable part 200 and the abuttable portion 441 of the fastener 440.

(f) The fixable part 200, the vibration damper 300, and the fixing part are similar to those of configuration (c), (d), or (e) above but different in that the fixable part 200 is provided with an insertion hole 230 (see FIG. 6) instead of the cutout 220. This difference will be solely described below in connection with configuration (f). The insertion hole 230 communicates with the attaching hole 210. The insertion hole 230 has a shape and dimension in the X-X' direction that is slightly larger than the cross-sectional shape and outer dimension in the X-X' direction of one of, or each of, the first vibration damper 310 and the second vibration damper 320. The coupling portion 330 fits in the attaching hole 210, the fitting is made in the following manner. The first vibration damper 310 or the second vibration damper 320, and then the coupling portion 330, are inserted through the insertion hole 230; with the coupling portion 330 received in the insertion hole 230, the coupling portion 330 is moved from the insertion hole 230 into the attaching hole 210.

(g) The fixable part 200, the vibration damper 300, and the fixing part are similar to those of configuration (e) above but different in the following points. The fixable part 200 is a plate that is provided with neither the attaching hole 210 nor the cutout 220 (see FIG. 7A). The vibration damper 300, similarly to that of configuration (b) above, includes the first vibration damper 310 and the second vibration damper 320 provided separately from each other (see FIG. 7B).

Where the fixable parts 200, the vibration dampers 300, and the fixing parts are provided in a one-to-multiple-to-multiple relationship, each of the fixable parts 200, corresponding ones of the vibration dampers 300 (i.e., some vibration dampers 300), and corresponding ones of the fixing parts (i.e., some fixing parts) may further have one of configurations (h) to (j) below. For convenience of the description, configurations (h) to (j) will be described referring to one of the fixable parts 200, corresponding ones of the vibration dampers 300 (i.e., the some vibration dampers 300), and corresponding ones of the fixing parts (i.e., the some fixing parts), but each configuration can apply to a plurality of fixable parts 200, and a plurality of vibration dampers 300 and a plurality of fixing parts corresponding to each fixable part 200.

(h) The fixable part 200, the some vibration dampers 300, and the some fixing parts are similar to the fixable part 200, the vibration damper 300, and the fixing part of configuration (a) above but different in the following points. The fixable part 200 is provided with a plurality of the attaching holes 210 (see FIG. 8A). The number of the some vibration dampers 300 and their first vibration dampers 310, and the number of the some fixing parts and their screws 400 and washers 430 correspond to the number of the attaching holes 210 of the fixable part 200 (see FIG. 8A). For convenience of description, the first vibration dampers 310 of the some vibration dampers 300 may be referred to as "some first vibration dampers 310," the screws 400 of the some fixing parts may be referred to as "some screws 400," and the washers 430 of the some fixing parts may be referred to as "some washers 430." In the second fixing state, the heads 420 of the some screws 400, the some washers 430, the fixable part 200, the some first vibration dampers 310, and the perimeter area 12 of the housing 10 are arranged in this order from the Z'-direction side; the through-holes 431 of the some washers 430 communicate with the corresponding attaching holes 210 of the fixable part 200; the through-holes 311 of the some first vibration dampers 310 communicate with the corresponding attaching holes 210 of the fixable part 200 and corresponding ones of the screw holes 14; and the screw bodies 410 of the some screws 400 are sequentially received in the through-holes 431 of the some washers 430, the corresponding attaching holes 210 of the fixable part 200, and the through-holes 311 of the some first vibration dampers 310 and screwed in the corresponding screw holes 14.

(i) The fixable part 200, the some vibration dampers 300, and the some fixing parts are similar to the fixable part 200, the vibration damper 300, and the fixing part of configuration (b) above but different in the following points. The fixable part 200 is provided with a plurality of the attaching holes 210 (see FIG. 8B). The number of the some vibration dampers 300 and their first vibration dampers 310 and second vibration dampers 320, and the number of the some fixing parts and their screws 400 and washers 430 correspond to the number of the attaching holes 210 of the fixable part 200 (see FIG. 8B). For convenience of description, the first vibration dampers 310 and the second vibration dampers 320 of the some vibration dampers 300 may be referred to respectively as "some first vibration dampers 310" and "some second vibration dampers 320," the screws 400 of the some fixing parts may be referred to as "some screws 400," and the washers 430 of the some fixing parts may be referred to as "some washers 430." In the second fixing state, the heads 420 of the some screws 400, the some washers 430, the some second vibration dampers 320, the fixable part 200, the some first vibration dampers 310, and the perimeter area 12 of the housing 10 are arranged in this order from the Z'-direction side; the through-holes 321 of the some second vibration dampers 320 communicate with the corresponding attaching holes 210 of the fixable part 200 and the through-holes 431 of the some washers 430; the through-holes 311 of the some first vibration dampers 310 communicate with the corresponding attaching holes 210 of the fixable part 200 and corresponding ones of the corresponding screw holes 14; and the screw bodies 410 of the some screws 400 are sequentially received in the through-holes 431 of the some washers 430, the through-holes 321 of the some second vibration dampers 320, the corresponding attaching holes 210 of the fixable part 200, and the through-holes 311 of the some first vibration dampers 310 and screwed in the corresponding screw holes 14.

(j) The fixable part 200, the some vibration dampers 300, and the some fixing parts are similar to the fixable part 200, the vibration damper 300, and the fixing part of configuration (c) but different in the following points. The fixable part 200 is provided with a plurality of the attaching holes 210 and a plurality of cutouts 220 (see FIG. 8C). The number of the some vibration dampers 300, and the number of the some fixing parts and their screws 400 and washers 430 (see FIG. 8C) corresponds to the number of the attaching holes 210 of the fixable part 200. The coupling portions 330 of the some vibration dampers 300 fit in the corresponding attaching holes 210. For convenience of description, the screws 400 of the some fixing parts may be referred to as "some screws 400," and the washers 430 of the some fixing parts may be referred to as "some washers 430." In the second fixing state, the heads 420 of the some screws 400, the some washers 430, the some vibration dampers 300, and the perimeter area 12 of the housing 10 are arranged in this order from the Z'-direction side; the second vibration dampers 320 of the some vibration dampers 300 are interposed between the fixable part 200 and the corresponding some washers 430; the first vibration dampers 310 of the some vibration dampers 300 are interposed between the fixable part 200 and the perimeter area 12 of the housing 10, the through-holes 340 of the some vibration dampers 300 communicate with the corresponding through-holes 431 of the some washers 430 and corresponding ones of the screw holes 14; the screw bodies 410 of the some screws 400 are sequentially received in the through-holes 431 of the some washers 430 and the through-holes 340 of the some vibration dampers 300, and screwed in the corresponding screw holes 14.

Where the fixable part 200, the vibration damper 300, and the fixing part are provided in a one-to-multiple-to-one relationship, each of the fixable parts 200, corresponding ones of the vibration dampers 300 (i.e., some vibration dampers 300), and a corresponding one of the fixing parts may further have either configuration (k) or (l) below. For convenience of the description, configurations (k) and (l) will be described referring to one of the fixable parts 200, a corresponding one of the vibration dampers 300, and corresponding ones of the fixing parts (i.e., the some fixing parts), but each configuration can apply to a plurality of fixable part 200, a plurality of fixing parts, and a plurality of vibration dampers 300 corresponding to each fixable part 200 and each fixing part.

(k) The fixable part 200, the some vibration dampers 300, and the fixing part are similar to the fixable part 200, the vibration damper 300, and the fixing part of configuration (d) above but different in the following points. The fixable part 200 is provided with a plurality of attaching holes 210 and a plurality of cutouts 220 (see FIG. 8D). The fixing part includes a plurality of screws 400 and a single fastener 440. The number of the some vibration dampers 300 and the number of the screws 400 correspond to the number of the attaching holes 210 of the fixable part 200. The number of the through-holes 441a of the abuttable portion 441 of the fastener 440 correspond to the number of the attaching holes 210 (see FIG. 8D). The coupling portions 330 of the some vibration dampers 300 fit in the corresponding attaching holes 210. In the second fixing state, the heads 420 of the screws 400, the abuttable portion 441 of the fastener 440, the some vibration dampers 300, and the perimeter area 12 of the housing 10 are arranged in this order from the Z'-direction side; the second legs of the fastener 440 abut the perimeter area 12 of the housing 10; the second vibration dampers 320 of the some vibration dampers 300 are interposed between the fixable part 200 and the abuttable portion 441 of the fastener 440; the first vibration dampers 310 of the some vibration dampers 300 are interposed between the fixable part 200 and the perimeter area 12 of the housing 10; the through-holes 340 of the some vibration dampers 300 communicate with the corresponding through-holes 441a of the abuttable portion 441 of the fastener 440 and corresponding ones of the screw holes 14; and the screw bodies 410 of the some screws 400 are sequentially received in the corresponding through-holes 441a of the fastener 440 and the corresponding through-holes 340 of the some vibration dampers 300 and screwed in the corresponding screw holes 14.

(l) The fixable part 200, the some vibration dampers 300, and the fixing part are similar to the fixable part 200, the vibration damper 300, and the fixing part of configuration (e) above but different in the following points. The fixable part 200 is provided with a plurality of attaching holes 210 and a plurality of cutouts 220 (see FIG. 8E). The number of the some vibration dampers 300 corresponds to the number of the attaching holes 210 of the fixable part 200 (see FIG. 8E). The coupling portions 330 of the some vibration dampers 300 fit in the corresponding attaching holes 210. The fixing part includes a plurality of screws 400 and a single fastener 440. In the second fixing state, the abuttable portion 441 of the fastener 440, the some vibration dampers 300, and the perimeter area 12 of the housing 10 are arranged in this order from the Z'-direction side; the second legs of the fastener 440 abut the perimeter area 12 of the housing 10; the second vibration dampers 320 of the some vibration dampers 300 are interposed between the fixable part 200 and the abuttable portion 441; the first vibration dampers 310 of the some vibration dampers 300 are interposed between the fixable part 200 and the perimeter area 12 of the housing 10; the through-holes 442a of the fastener 440 communicate with corresponding ones of the screw holes 14 in the perimeter area 12 of the housing 10; and the screw bodies 410 of the screws 400 are received in the corresponding through-holes 442a of the fastener 440 and screwed in the corresponding screw holes 14.

Where the fixable parts 200, the vibration dampers 300, and the fixing parts are provided in a one-to-one-to-multiple relationship, each of the fixable parts 200, a corresponding one of the vibration dampers 300, and corresponding ones of the fixing parts (i.e., some fixing parts) may further have one of configurations (m) to (o) below. For convenience of the description, configurations (m) to (o) will be described referring to one of the fixable parts 200, a corresponding one of the vibration dampers 300, and corresponding ones of the fixing parts (i.e., the some fixing parts), but each configuration can apply to a plurality of the fixable part 200, a plurality of the vibration dampers 300, and a plurality of fixing parts corresponding to each fixable part 200 and each vibration damper 300.

(m) Configuration (h) is modified as follows. The some first vibration dampers 310 are replaced with a single first vibration damper 310 having a plurality of through-holes 311; and the number of the through-holes 311 corresponds to the number of the attaching holes 210 (see FIG. 8F). In the first fixing state, the heads 420 of the some screws 400, the some washers 430, the fixable part 200, the first vibration damper 310, and the perimeter area 12 of the housing 10 are arranged in this order from the Z'-direction side; the through-holes 431 of the some washers 430 communicate with the corresponding attaching holes 210 of the fixable part 200; the through-holes 311 of the first vibration damper 310 communicate with the corresponding attaching holes 210 of the fixable part 200 and corresponding ones of the screw holes 14; the screw bodies 410 of the some screws 400 are sequentially received in the corresponding through-holes 431 of the some washers 430, the corresponding attaching holes 210 of the fixable part 200, and the corresponding through-holes 311 of the first vibration damper 310 and screwed in the corresponding the screw holes 14.

(n) Configuration (i) is modified as follows. The some first vibration dampers 310 are replaced with a single first vibration damper 310 having a plurality of through-holes 311; the some second vibration dampers 320 are replaced with a single second vibration damper 320 having a plurality of through-holes 321; and the number of the through-holes 311 of the first vibration damper 310 and the number of the through-holes 321 of the second vibration damper 320 correspond to the number of the attaching holes 210 (see FIG. 8G). In the first fixing state, the heads 420 of the some screws 400, the some washers 430, the second vibration damper 320, the fixable part 200, the first vibration damper 310, and the perimeter area 12 of the housing 10 are arranged in this order from the Z'-direction side; the through-holes 321 of the second vibration damper 320 communicate with the corresponding attaching holes 210 of the fixable part 200 and the corresponding through-holes 431 of the some washers 430; the through-holes 311 of the first vibration damper 310 communicate with the corresponding attaching holes 210 of the fixable part 200 and the corresponding screw holes 14; and the screw bodies 410 of the some screws 400 are sequentially received in the corresponding through-holes 431 of the some washers 430, the corresponding through-holes 321 of the second vibration damper 320, the corresponding attaching holes 210 of the fixable part 200, and the corresponding through-holes 311 of the first vibration damper 310 and screwed in the corresponding screw holes 14.

(o) Configuration (j) is modified as follows. The some first vibration dampers 310 are replaced with a single first vibration damper 310; the some second vibration dampers 320 are replaced with a single second vibration damper 320; the number of the coupling portions 330 and the number of the through-holes 340 correspond to the number of the attaching holes 210 (see FIG. 8H); the plurality of coupling portions 330 couples between the first vibration damper 310 and the second vibration damper 320; and the plurality of through-holes 340 extends in the Z-Z' direction through the first vibration damper 310, the second vibration damper 320, and the corresponding coupling portion 330. In the first fixing state, the heads 420 of the some screws 400, the some washers 430, the vibration damper 300, and the perimeter area 12 of the housing 10 are arranged in this order from the Z'-direction side; the second vibration damper 320 of the vibration damper 300 is interposed between the fixable part 200 and the some washers 430, the first vibration damper 310 of the vibration damper 300 is interposed between the fixable part 200 and the perimeter area 12 of the housing 10, the through-holes 340 of the vibration damper 300 communicate with the corresponding through-holes 431 of the some washers 430 and the corresponding ones of the screw holes 14; and the screw bodies 410 of the some screws 400 are sequentially received in the corresponding through-holes 431 of the some washers 430 and the corresponding through-holes 340 of the vibration damper 300 and screwed in the corresponding screw holes 14.

Where the fixable parts 200, the vibration dampers 300, and the fixing parts are provided in a one-to-one-to-one relationship, each of the fixable parts 200, each of the vibration dampers 300, and each of the fixing parts may further have either configuration (p) or (q) below. For convenience of description, configurations (p) and (q) will be described referring to one of the fixable parts 200, a corresponding one of the vibration dampers 300, and a corresponding one of the fixing parts, but each configuration can apply to more than one of the fixable parts 200, the corresponding vibration dampers 300, and the corresponding fixing parts.

(p) Configuration (k) is modified as follows. The some first vibration dampers 310 are replaced with a single first vibration damper 310; the some second vibration dampers 320 are replaced with a single second vibration damper 320; the number of the coupling portions 330 and the number of the through-holes 340 correspond to the number of the attaching holes 210 (see FIG. 8I); the plurality of coupling portions 330 couples between the first vibration damper 310 and the second vibration damper 320; and the plurality of through-holes 340 extends in the Z-Z' direction through the first vibration damper 310, the second vibration damper 320, and the corresponding coupling portion 330. In the first fixing state, the heads 420 of the screws 400, the abuttable portion 441 of the fastener 440, the vibration damper 300, and the perimeter area 12 of the housing 10 are arranged in this order from the Z'-direction side; the second legs of the fastener 440 abut the perimeter area 12 of the housing 10; the second vibration damper 320 of the vibration damper 300 is interposed between the fixable part 200 and the abuttable portion 441 of the fastener 440; the first vibration damper 310 of the vibration damper 300 is interposed between the fixable part 200 and the perimeter area 12 of the housing 10; the through-holes 340 of the vibration damper 300 communicate with the corresponding through-holes 441a of the abuttable portion 441 of the fastener 440 and the corresponding ones of the screw holes 14; and the screw bodies 410 of the some screws 400 are sequentially received in the corresponding through-holes 441a of the fastener 440 and the corresponding through-holes 340 of the vibration damper 300 and screwed in the corresponding screw holes 14.

(q) Configuration (l) is modified as follows. The some first vibration dampers 310 are replaced with a single first vibration damper 310; the some second vibration dampers 320 are replaced with a single second vibration damper 320; the number of the coupling portions 330 corresponds to the number of the attaching holes 210 (see FIG. 8J); the plurality of coupling portions 330 couples between the first vibration damper 310 and the second vibration damper 320. In the first fixing state, the abuttable portion 441 of the fastener 440, the vibration damper 300, and the perimeter area 12 of the housing 10 are arranged in this order from the Z'-direction side; the second legs of the fastener 440 abut the perimeter area 12 of the housing 10; the second vibration damper 320 of the vibration damper 300 is interposed between the fixable part 200 and the abuttable portion 441; the first vibration damper 310 of the vibration damper 300 is interposed between the fixable part 200 and the perimeter area 12 of the housing 10; the through-holes 442a of the fastener 440 communicate with the corresponding ones of the screw holes 14 in the perimeter area 12 of the housing 10; and the screw bodies 410 of the screws 400 are received in the corresponding through-holes 442a of the fastener 440 and screwed in the corresponding screw holes 14.

In any of the configurations above in which each of the fixable parts 200 is provided with a plurality of cutouts 220, the cutouts 220 of each fixable part 200 may be replaced with a plurality of insertion holes 230.

Each of the vibration dampers 300 of any of the above aspects may further include at least one first protrusion 350 (see FIGS. 2A to 2D, 3A and 3B, and 9A). The first protrusion or protrusions 350 are constituted by the elastic substance described above, extend in the Z direction from the first vibration damper 310, and are elastically deformable such as to contract in the Z-Z' direction. In this case, each first vibration damper 310 abuts the corresponding fixable part 200, and the first protrusion or protrusions 350 thereof is held between the first vibration damper 310 and the perimeter area 12 of the housing 10.

Each of the vibration dampers 300 of any of the above aspects may further include at least one second protrusion 360 (see FIGS. 2A to 2D, 3A and 3B, and 9B). The second protrusion or protrusions 360 are constituted by the elastic substance described above, extend in the Z' direction from the second vibration damper 320, and are elastically deformable such as to contract in the Z-Z' direction. In this case, each second vibration damper 320 abuts the corresponding fixable part 200, and the second protrusion or protrusions 360 thereof are held between the second vibration damper 320 and the abuttable portion of any of the above aspects.

It should be noted that the vibration dampers 300 illustrated in FIGS. 1A to 3B and the vibration dampers 300 illustrated in FIG. 5A have the same configuration, except for the presence or absence of the first protrusions 350 and the second protrusions 360. In other words, the structure S1 of the first embodiment and the structure S1 of the third variant have the same configuration, except for the presence or absence of the first protrusions 350 and the second protrusions 360.

The sensor unit U1 may further include a circuit board 700. The circuit board 700 may be fixed to the body 100 from the Z'-direction side. In this case, the detection sensor 500 and the vibration generator 600 may be electrically connected to the circuit board 700. The sensor unit U1 may further include a load detector or a ranging sensor (not illustrated). The load detector or the ranging sensor also be electrically connected to the circuit board 700.

Where a load detector is provided, it may be arranged as follows, for example: between the head 420 of the screw 400 and the washer 430, or between the washer 430 and the fixable part 200, in configuration (a) above; between the head 420 of the screw 400 and the washer 430, or between the washer 430 and the second vibration damper 320, in configuration (b) or (c) above; or between the head 420 of the screw 400 and the abuttable portion 441 of the fastener 440, or between the abuttable portion 441 and the second vibration damper 320, in configuration (d), (e), or (g) above. The load detector includes a pressure-sensitive element. When a detection target comes into contact with the touch region of the overlay 20, the touch region and the body 100 are pressed in the Z' direction and securely sandwich the load detector therebetween. The pressure-sensitive element of the load detector is thus subjected to pressure, in accordance with which a voltage of the pressure-sensitive element changes.

Where a ranging sensor is provided, it may be an optical, ultrasonic, or electromagnetic sensor configured to measure a distance and mounted on a face on the Z'-direction side of the circuit board 700. The ranging sensor may be configured to output an infrared or other kind of light beams, ultrasonic waves, or electromagnetic waves, to an object on the Z'-direction side relative to the ranging sensor, and receive an infrared or other kind of light beams, ultrasonic waves, or electromagnetic waves that are reflected by the object, thereby measure the distance between the ranging sensor and the object on a continual basis, and in accordance with the measurement result, output a signal, or changes a signal. When a detection target comes into contact with the touch region of the overlay 20, the touch region and the body 100 are pressed in the Z' direction, changing the distance between the ranging sensor and the object. As a result, the ranging sensor outputs a signal or changes a signal.

The sensor unit U1 may further include a controller (not illustrated). The controller is constituted by a logic circuit (e.g., an integrated circuit (IC)) or software to processed by a processor or the like. In the former case, the controller may be mounted on the circuit board 700. Where the load detector is provided, the controller may be configured to drive the vibration generator 600 to vibrate the body 100 in response to a change in the signal of the load detector. Where the ranging sensor is provided, the controller may be configured to drive the vibration generator 600 for a predetermined period of time to vibrate the body 100 in response to a signal, or a change in a signal, outputted from the ranging sensor. Where the load detector and ranging sensor are omitted, the controller may be configured to drive the vibration generator 600 to vibrate the body 100 in response to the above-described change in the signal of the detection sensor 500. It should be appreciated that that the circuit board 700 and/or the controller can be omitted in the sensor unit U1. In this case, the circuit board 700 and/or the controller may be replaced with another circuit board and/or controller provided in the housing 10, to which the sensor unit U1 is attached, and the detection sensor 500 and the vibration generator 600 may be electrically connectable to such circuit board and/or controller. Also in the case where the load detector or the ranging sensor is provided, it may be electrically connected to such another circuit board and/or controller.

The sensor unit U1 may further include a light emitter (not illustrated), such as one or more LEDs, a display device, or the like. The light emitter may be mounted on the face on the Z-direction side of the circuit board 700, or fixed to the body 100 such as to be located on the Z-direction side relative to the circuit board 700. In the latter case, the light emitter may be electrically connected to the circuit board 700. The light emitter is configured to emit light in the Z direction. In this case, the body 100 and the detection sensor 500 may be translucent or transparent in its entirety or in a portion thereof on the Z-direction side relative the light emitter (for example, in a portion between the icons mentioned above and the light emitter), and the overlay 20 may be translucent or transparent in the entire portion covering the accommodation hole 11 or a part of the portion covering the accommodation hole 11 that is located on the Z-direction side relative to the light emitter (for example, a portion between the icons mentioned above and the light emitter). These configurations allow light emitted from the light emitter to pass through the body 100, the detection sensor 500, and the overlay 20.

For convenience of description, a "vibratable unit" hereinafter refers to a unit that includes at least the body 100, the plurality of fixable parts 200, and the detection sensor 500 and is configured to be vibrated by the vibration generator 600. Where the vibration generator 600 is fixed to the body 100, the vibratable unit further includes the vibration generator 600. Where the circuit board 700 is provided, the vibratable unit further includes the circuit board 700. Where the circuit board 700 is provided with the controller, the ranging sensor, and/or the light emitter mounted thereon, the vibratable unit further includes the controller, the ranging sensor, and/or the light emitter in addition to the circuit board 700. Where the circuit board 700 and the light emitter are provided with the light emitter fixed to the body 100, the vibratable unit further includes the light emitter in addition to the circuit board 700.

The collective elastic modulus (spring constant) of the all vibration dampers 300 of any of the above aspects can be set properly, in view of the mass of the vibratable unit, such that the all vibration dampers 300 will absorb vibrations of the vibratable unit of any of the above aspects. In other words, the collective elastic modulus (spring constant) of the all vibration dampers 300 of any of the above aspects is only required to be set, in view of the mass of the vibratable unit, such that the all vibration dampers 300 prevents or suppresses transmission of vibrations of the vibratable unit of any of the above aspects to the perimeter area 12 of the housing 10 (this may be hereinafter referred to as vibration-insulating property).

In order to adjust the vibration-insulating property with respect to the perimeter area 12 of the housing 10 and a resonance frequency of the vibratable unit of any of the above aspects, it is possible to adjust the collective elastic modulus (spring constant) of the all vibration dampers 300 of any of the above aspects, or adjust the mass of the vibratable unit of any of the above aspects, or adjust both of these.

The collective elastic modulus (spring constant) of the all vibration dampers 300 can be adjusted as follows, for example. Each of the vibration dampers 300 includes a portion or portions (hereinafter referred to as a first contact portion or portions) in contact with the perimeter area 12 of the housing 10 and a portion or portions (hereinafter referred to as a contact portion or portions) in contact with a corresponding one of the abuttable portions. The sum of the cross-sectional areas in the X-X' direction of the first and second contact portions of each vibration damper 300 will be referred to as the "cross-sectional area" of the contact portions of each vibration damper 300. The elastic modulus (spring constant) of each vibration damper 300 of any of the above aspects is proportional to the cross-sectional area of the contact portions of each vibration damper 300 and inversely proportional to a dimension (length) in the Z-Z' direction of each vibration damper 300. These relations allow adjustment of the collective elastic modulus (spring constant) of the all vibration dampers 300 by adjusting the cross-sectional area and/or the dimension in the Z-Z' direction of the contact portion of each vibration damper 300. Where one of the contact portions of each vibration damper 300 is constituted by the at least one first protrusion 350, changing the number, the dimension in the Z-Z' direction, the area in contact with the housing 10, and/or the shape of the at least one first protrusion 350 allows adjustment of the elastic modulus (spring constant) of each vibration damper 300 and consequently allows adjustment of the collective elastic modulus (spring constant) of the all vibration dampers 300. Where one of the contact portions of each vibration damper 300 is constituted by the at least one second protrusion 360, changing the number, the dimension in the Z-Z' direction, the area in contact with the corresponding abuttable portion of any of the above aspects, and/or the shape of the at least one second protrusion 360 allows adjustment of the elastic modulus (spring constant) of each vibration damper 300 and consequently allows adjustment of the collective elastic modulus (spring constant) of the all vibration dampers 300. Where the contact portions of each vibration damper 300 are constituted by the at least one first protrusion 350 and the at least one second protrusion 360, changing the respective numbers, the respective dimensions in the Z-Z' direction, the above-described contact areas, and/or the shapes of the at least one first protrusion 350 and the at least one second protrusion 360 allows adjustment of the elastic modulus (spring constant) of each vibration damper 300 and consequently allows adjustment of the collective elastic modulus (spring constant) of the all vibration dampers 300.

The mass of the vibratable unit of any of the above aspects may be adjusted, for example, by increasing or decreasing components of the vibratable unit, adjusting the wall thickness of the body 100 of the vibratable unit, increasing or decreasing ribs provided at the body 100 of the vibratable unit, and/or increasing or decreasing of weights (not illustrated) fixed to the body 100.

It should be appreciated that a natural frequency (f0) of the vibratable unit can be calculated by a formula indicated below, where "M" is the mass of the vibratable unit and "k" is the collective elastic modulus (spring constant) of the all vibration dampers 300. This formula can, but is not required to, be used to adjust M and/or k in order to set the natural frequency (f0) of the vibratable unit to a frequency within, or close to, a frequency band that a user easily senses vibrations through the detection target.

$$f_0 = \frac{1}{2\pi}\sqrt{k/M} \qquad \text{Formula 1}$$

The sensor unit U1 and the structure S1 described above provide the following technical features and effects (1) to (7).

Technical Feature and Effect (1): The sensor unit U1 is easy to attach from the Z'-direction side to the perimeter area 12 of the accommodation hole 11 of the housing 10 for the following reasons. The first portion 101 of the body 100 can be accommodated in the accommodation hole 11 of the housing 10 from the Z'-direction side. In the accommodation state, the second portion 102 of the body 100 is located on the Z'-direction side relative to the accommodation hole 11, and the fixable parts 200 provided in the second portion 102 are located on the Z'-direction side relative to the perimeter area 12 of the housing 10. Therefore, each of the fixable parts 200 can be fixed to the perimeter area 12 of the housing 10 from the Z'-direction side via a corresponding one vibration damper 300 or corresponding some vibration dampers 300.

Technical Feature and Effect (2): The sensor unit U1 and the structure S1 has an improved the vibration-insulating property with respect to the perimeter area 12 of the housing 10. This is because vibrations of the vibratable unit of the sensor unit U1 are absorbed by the vibration dampers 300 and therefore will not be, or are unlikely to be, transmitted to the perimeter area 12 of the housing 10. In particular, where each of the vibration damper 300 includes the first vibration damper 310 and the second vibration damper 320, vibrations of the vibratable unit of the sensor unit U1 are absorbed by the first vibration dampers 310 interposed between the corresponding fixable parts 200 and the perimeter area 12 of the housing 10, and therefore will not be, or are unlikely to be, transmitted to the perimeter area 12 of the housing 10 through the fixable parts 200. The vibrations are also absorbed by the second vibration dampers 320 interposed between the corresponding fixable parts 200 and the corresponding abuttable portions of the fixing parts, and therefore will not be, or are unlikely to be, transmitted to the perimeter area 12 of the housing 10 from the fixable parts 200 through the abuttable portions of the fixing parts.

Technical Feature and Effect (3): It is possible to adjust the vibration-insulating property with respect to the perimeter area 12 of the housing 10 and/or the resonance frequency band of the vibratable unit of any of the above aspects by adjusting elastic modulus (spring constant) of the vibration dampers 300 and/or the mass of the vibratable unit.

Technical Feature and Effect (4): Where the detection sensor 500 and the body 100 are arranged in the first continuous arrangement described above, there is no or little height difference between the first face 101a of the body 100 and the face on the Z-direction side of the perimeter area 12 of the accommodation hole 11 of the housing 10. Where the detection sensor 500 and the body 100 are arranged in the second continuous arrangement, there is no or little height difference between the first face 510 of the detection sensor 500 and the face on the Z-direction side of the perimeter area 12 of the accommodation hole 11 of the housing 10. Where the at least one layer of the overlay 20 is flexible, stretchable, and/or elastic and the overlay 20 covers the accommodation hole 11 of the housing 10 and the perimeter area 12 thereof at least from the Z-direction side, the overlay 20 distorts itself and thereby absorbs the height difference, if any, so as to prevent the height difference from appearing in the overlay 20. In particular, where the overlay 20 includes the cushioning portion 22, the cushioning portion 22 can being recessed conforming to the height difference and thereby absorb the height difference.

Technical Feature and Effect (5): Where the at least one layer of the overlay 20 is flexible, stretchable, and/or elastic, the overlay 20 flexes, expands and contracts, or elastically deforms in response to vibrations of the body 100 and the detection sensor 500, so that the at least one layer of the overlay 20 absorb the vibrations and thereby make it difficult for the vibrations to be transmitted to the perimeter area 12 of the housing 10. In particular, where the overlay 20 includes the cushioning portion 22, the overlay 20 absorbs the vibrations of the body 100 and the detection sensor 500 and make it difficult for the vibrations to be transmitted to the perimeter area 12 of the housing 10.

Technical Feature and Effect (6): Where each of the vibration dampers 300 includes the at least one first protrusion 350, even if the vibratable unit is subjected to a large load from the Z'-direction side and thereby displaced in the Z direction, the at least one first protrusion 350 of each vibration damper 300 is compressed and contracts between the corresponding first vibration damper 310 and the perimeter area 12 of the housing 10 so as to be buried in the first vibration damper 310. As a result, the first vibration damper 310 of each vibration damper 300 abuts the perimeter area 12 of the housing 10, increasing the area of each vibration damper 300 that is in contact with the perimeter area 12 of the housing 10, and thereby suppressing further expansion and contraction of each vibration damper 300 in the Z-Z' direction.

Technical Feature and Effect (7): Where each of the vibration dampers 300 includes the at least one second protrusion 360, even if the vibratable unit is subjected to a large load from the Z-direction side and thereby displaced in the Z' direction, the at least one second protrusion 360 of each vibration damper 300 is compressed and contracts between the corresponding second vibration damper 320 and the corresponding abuttable portion so as to be buried in the second vibration damper 320. As a result, the second vibration damper 320 of each vibration damper 300 abuts the abuttable portion, increasing the area of each vibration damper 300 that is in contact with the corresponding abuttable portion increases, and thereby suppressing further expansion and contraction of each vibration damper 300 in the Z-Z' direction.

Second Embodiment

Figure 10:
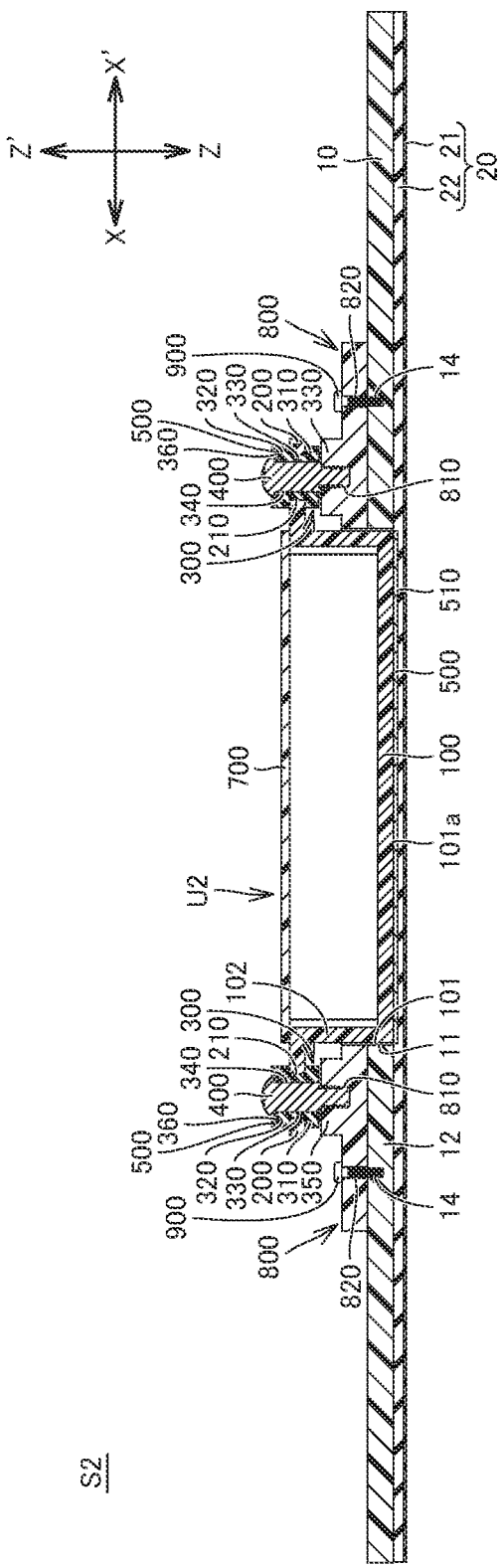
FIG. 10 is a cross-sectional view, corresponding to FIG. 2B, of a structure for attaching a sensor unit according to a second embodiment of the invention.
Figure 11:
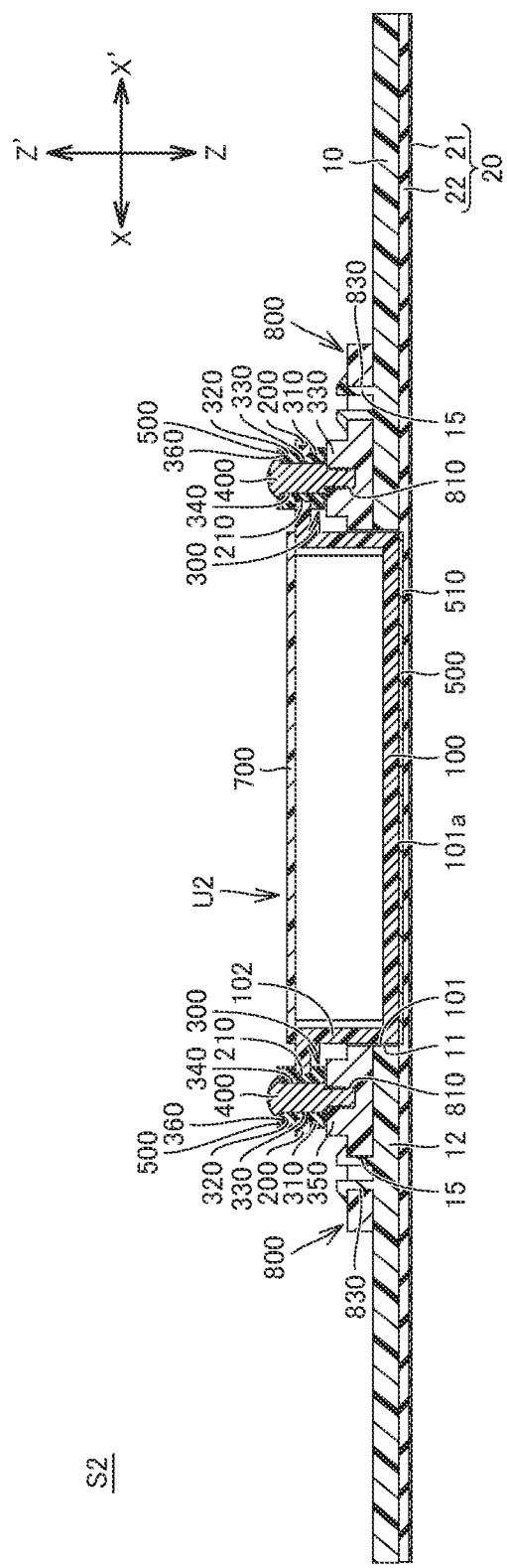
FIG. 11 is a cross-sectional view, corresponding to FIG. 2B, of a variant of the structure of the second embodiment.

Hereinafter described is a structure S2 for attaching a sensor unit U2 according to a plurality of embodiments, including a second embodiment and variants thereof, of the invention, with reference to FIGS. 10 and 11. FIG. 10 illustrates the structure S2 of the second embodiment. FIG. 11 illustrates a variant of the structure S2 of the second embodiment. FIGS. 10 and 11 also indicate a Z-Z' direction and an X-X' direction.

The structure S2 has substantially the same configuration as the structure S1, except for differences that the sensor unit U2 further includes at least one relay 800 and a plurality of screws 900, and that the at least one relay 800 is fixed to a perimeter area 12 of a housing 10. The structure S2 will now be described focusing on the differences from the structure S1 and omitting overlapping descriptions.

Where the at least one relay 800 is a single relay 800, the relay 800 may have an accommodation hole extending through the relay 800 in the Z-Z' direction. In this case, the body 100 includes a third portion between a first portion 101 and a second portion 102. The third portion is accommodated in the accommodation hole of the relay 800, the first portion 101 is located on the Z-direction side relative to the accommodation hole of the relay 800, the second portion 102 is located on the Z'-direction side relative to the accommodation hole of the relay 800, and the second portion 102 is provided with a plurality of fixable parts 200 located on the Z'-direction side relative to a perimeter area of the accommodation hole of the relay 800.

Where the at least one relay 800 is a plurality of relay 800, the relays 800 includes at least one set of relays 800, and the or each set includes two relays 800. The relays 800 of the or each set are arranged in spaced relation to each other in the X-X' direction, i.e., includes a relay 800 located on the X-direction side and the other relay 800 located on the X'-direction side. The third portion of the body 100 is arranged between the relays 800 of the or each set, the first portion 101 is located on the Z-direction side relative to the relays 800 of the or each set, and the second portion 102 is located on the Z'-direction side relative to the relays 800 of the or each set. One or more of the fixable parts 200 that are located on the X-direction side may be located on the Z'-direction side relative to the relay or relays 800 on the X-direction side, and one or more of the fixable parts 200 that are located on the X'-direction side the fixable parts 200 may be located on the Z'-direction side relative to the relay or relays 800 on the X'-direction side.

In the accommodation state described above, the relay or relays 800 abut the perimeter area 12 of the housing 10 from the Z'-direction side. The relay or relays 800 include a plurality of screw holes 810 and a plurality of communicating holes 820. The screw holes 810 are open at least in the Z' direction. The communicating holes 820 extends in the Z-Z' direction through the relay or relays 800 and communicate with the corresponding screw holes 14 of the perimeter area 12 of the housing 10 in the accommodation state. The screws 900 are received in the corresponding communicating holes 820 and screwed in the corresponding screw holes 14 of the perimeter area 12 of the housing 10. In this manner, the relay or relays 800 are fixed to the perimeter area 12 of the housing 10 from the Z'-direction side.

Each of the fixable parts 200 may be fixed to the corresponding relay 800 via a corresponding one vibration damper 300 from the Z'-direction side. This fixing state may be hereinafter referred to as a third fixing state. In the third fixing state, a corresponding one vibration damper 300 is at least partly interposed between each fixable part 200 and the corresponding relay 800. Each fixable part 200 may be fixed to the corresponding relay 800 via corresponding some vibration dampers 300 from the Z'-direction side. This fixing state may be hereinafter referred to as a fourth fixing state. In the fourth fixing state, the some corresponding vibration dampers 300 are at least partly interposed between each of the fixable parts 200 and the corresponding relay or relays 800.

Where the fixable parts 200, the vibration dampers 300, and fixing parts are provided in a one-to-one-to-one relationship, each of the fixable parts 200, a corresponding one of the vibration dampers 300, and a corresponding one of the fixing parts may have any of the configurations (a) to (g) described above, except that a screw body 410 of a screw 400 of each fixing part is not screwed in a screw hole 14 but in a corresponding one of the screw holes 810 of the corresponding relay 800 in the third fixing state. Configuration (a) may be provided without the fixing part. In this case, the fixable part 200 and the vibration damper 300 is similar to those of configuration (a) above but different in the following points. The fixable part 200 is a plate without the attaching hole 210. The first vibration damper 310 of the vibration damper 300 is provided without the through-hole 311. The fixable part 200 is bonded to the first vibration damper 310, and the first vibration damper 310 is bonded to the at least one relay 800, so that the fixable part 200 is fixed to the at least one relay 800 via the first vibration damper 310.

Where the fixable parts 200, the vibration dampers 300, and the fixing parts are provided in a one-to-multiple-to-multiple relationship, each of the fixable parts 200, corresponding ones of the vibration dampers 300 (i.e., some vibration dampers 300), and corresponding ones of the fixing parts (i.e., some fixing parts) may have one of configurations (h) to (j) above but different in the following point. In the fourth fixing state, the screw bodies 410 of the screws 400 of the some fixing parts are not screwed in the corresponding ones of the screw holes 14, but in the corresponding screw holes 810 of the corresponding relay 800.

Where the fixable part 200, the vibration damper 300, and the fixing part are provided in a one-to-multiple-to-one relationship, each of the fixable parts 200, corresponding ones of the vibration dampers 300 (i.e., some vibration dampers 300), and a corresponding one of the fixing parts may further have either configuration (k) or (l) above but different in the following point. In the fourth fixing state, the screw bodies 410 of the screws 400 of each fixing part are not screwed in the corresponding ones of the screw holes 14 but in the corresponding screw holes 810 of the corresponding relay 800.

Where the fixable parts 200, the vibration dampers 300, and the fixing parts are provided in a one-to-one-to-multiple relationship, each of the fixable parts 200, a corresponding one of the vibration dampers 300, and corresponding ones of the fixing parts (i.e., some fixing parts) may have one of configurations (m) to (o) above but different in the following point. In the third fixing state, the screw bodies 410 of the screws 400 of each fixing part are not screwed in the corresponding ones of the screw holes 14 but in the corresponding screw holes 810 of the corresponding relay 800.

Where the fixable parts 200, the vibration dampers 300, and the fixing parts are provided in a one-to-one-to-one relationship, each of the fixable parts 200, a corresponding one of the vibration dampers 300, and a corresponding one of the fixing parts may have either configuration (p) or (q) above but different in the following point. In the third fixing state, the screw bodies 410 of the screws 400 of each fixing part are not screwed in the corresponding ones of the screw holes 14 but in the corresponding screw holes 810 of the corresponding relay 800.

In any of the configurations above in which each of the fixable parts 200 is provided with a plurality of cutouts 220, the cutouts 220 of each fixable part 200 may be replaced with a plurality of insertion holes 230.

The relay or relays 800 may include a plurality of engagement holes 830, in place of the plurality of communicating holes 820. The engagement holes 830 extend in the Z-Z' direction through the relay or relays 800. In this case, the perimeter area 12 of the housing 10 is provided with a plurality of engaging portions 15. Each of the engaging portions 15 may include a plurality of arms extending in the Z' direction from the perimeter area 12 of the housing 10 and outwardly protruding claws at free ends on the Z'-direction side of the respective arms. In this case, in the accommodation state, the arms of each engaging portion 15 of the housing 10 are inserted through the corresponding engagement hole 830 of the corresponding relay 800, and the claws of each engaging portion 15 are hooked on respective edges on the Z'-direction side of the corresponding engagement hole 830. This engagement arrangement also makes it possible to fix the relay or relays 800 to the perimeter area 12 of the housing 10. Each of the engaging portions 15 may be modified to a protrusion to fit in a corresponding engagement hole 830 of the corresponding relay 800.

The relay or relays 800 may alternatively be configured to be bonded to the perimeter area 12 of the housing 10. In this case, the relay or relays 800 does not include the communicating holes 820, the engagement holes 830, the screw holes 14, or the engaging portions 15.

The sensor unit U2 and the structure S2 described above provide the following technical features and effects (8) to (10) in addition to the above-described technical features and effects (3) to (5) and (7) discussed for the sensor unit U1 and the structure S1.

Technical Feature and Effect (8): The sensor unit U2 is easy to attach from the Z'-direction side to the perimeter area 12 of the accommodation hole 11 of the housing 10 for the following reasons. The first portion 101 of the body 100 can be accommodated in the accommodation hole 11 of the housing 10 from the Z'-direction side. The plurality of fixable parts 200 provided in the second portion 102 of the body 100 are fixed to the at least one relay 800. In the accommodation state, the at least one relay 800 is located on the Z'-direction side relative to the perimeter area 12 of the housing 10 and therefore can be fixed to the perimeter area 12 of the housing 10 from the Z'-direction side.

Technical Feature and Effect (9): The sensor unit U2 and the structure S2 has an improved the vibration-insulating property with respect to the perimeter area 12 of the housing 10. This is because vibrations of the vibratable unit of the sensor unit U2 are absorbed by the vibration dampers 300 and therefore will not be, or are unlikely to be, transmitted to the at least one relay 800. As a result, the vibrations will not be, or are unlikely to be, transmitted to the perimeter area 12 of the housing 10 through the at least one relay 800. where each of the vibration damper 300 includes the first vibration damper 310 and the second vibration damper 320, vibrations of the vibratable unit of the sensor unit U2 are absorbed by the first vibration dampers 310 interposed between the corresponding fixable parts 200 and the at least one relay 800, and therefore will not be, or are unlikely to be, transmitted to the at least one relay 800 through the fixable parts 200. The vibrations are also absorbed by the second vibration dampers 320 interposed between the corresponding fixable parts 200 and the corresponding abuttable portions of the fixing parts, and therefore will not be, or are unlikely to be, transmitted to the at least one relay 800 through the abuttable portions of the fixing parts.

Technical Feature and Effect (10): Where each of the vibration dampers 300 includes the at least one first protrusion 350, even if the vibratable unit is subjected to a large load from the Z'-direction side and thereby displaced in the Z direction, the at least one first protrusion 350 of each vibration damper 300 is compressed and contracts between the corresponding first vibration damper 310 and the at least one relay 800 so as to be buried in the first vibration damper 310. As a result, the first vibration damper 310 of each vibration damper 300 abuts the corresponding relay 800, increasing the area of each vibration damper 300 that is in contact with the at least one relay 800, and thereby suppressing further expansion and contraction of each vibration damper 300 in the Z-Z' direction. In this case, the or each relay 800 includes a first abuttable portion located on the Z-direction side relative to the at least one first protrusion 350, and the at least one first protrusion 350 is held between the or each relay 800 and a corresponding one of the fixable parts 200.

Third Embodiment

Figure 12:
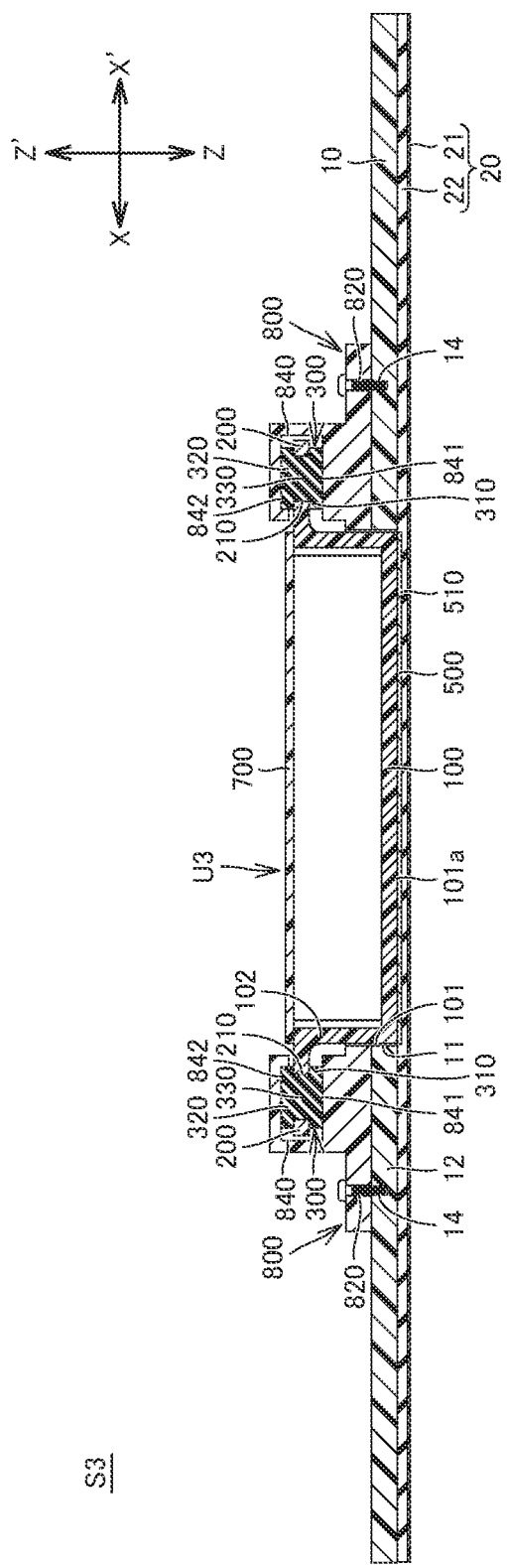
FIG. 12 is a cross-sectional view, corresponding to FIG. 2B, of a structure for attaching a sensor unit according to a third embodiment of the invention.

Hereinafter described is a structure S3 for attaching a sensor unit U3 according to a plurality of embodiments, including a third embodiment and variants thereof, of the invention, with reference to FIG. 12. FIG. 12 illustrates the structure S3 of the third embodiment. FIG. 12 also indicates a Z-Z' direction and an X-X' direction.

The structure S3 includes substantially the same configuration as the structure S2, except for differences that the sensor unit U3 includes a plurality of relays 800, that the relays 800 include a plurality of fixing holes 840 in place of the plurality of screw holes 810, and that a plurality of fixable parts 200 are flanges extending from a second portion 102 of a body 100. The structure S3 will now be described focusing on the differences from the structure S2 and omitting overlapping descriptions.

Where the plurality of fixable parts 200 and a plurality of vibration dampers 300 are provided in a one-to-one relationship, they may have either configuration (e) or (q) above. In either case, the fixable parts 200 and the vibration dampers 300 include at least one fixable part 200 and at least one vibration damper 300 on the X-direction side, and at least one fixable part 200 and at least one vibration damper 300 on the X'-direction side. The or each fixable part 200 on the X-direction side extends in the X direction from the second portion 102 of the body 100. The or each fixable part 200 on the X'-direction side extends in the X' direction from the second portion 102 of the body 100. The or each vibration damper 300 on the X-direction side includes a coupling portion 330 fitting in an attaching hole 210 of the corresponding fixable part 200 on the X-direction side. The or each vibration damper 300 on the X'-direction side includes a coupling portion 330 fitting in an attaching hole 210 of the corresponding fixable part 200 on the X'-direction side.

The plurality of relays 800 include a relay 800 on the X-direction side and a relay 800 on the X'-direction side. The relay 800 on the X direction includes at least one fixing hole 840 on the X-direction side opening in the X' direction, and at least one first abuttable portion 841 and at least one second abuttable portion 842 on the X-direction side, which are walls on the Z- and Z'-direction sides, respectively, of the at least one fixing hole 840. The relay 800 on the X' direction includes at least one fixing hole 840 on the X'-direction side opening in the X direction, and at least one first abuttable portion 841 and at least one second abuttable portion 842 on the X'-direction side, which are walls on the Z- and Z'-direction sides, respectively, of the at least one fixing hole 840.

The or each fixing hole 840 on the X-direction side receives, from the X'-direction side, the fixable part or parts 200 on the X-direction side and the vibration damper or dampers 300 on the X-direction side. The distance in the Z-Z' direction, from the first abuttable portion 841 to the second abuttable portion 842, of the or each the fixing hole 840 on the X-direction side is substantially the same as, or slightly smaller than, the dimension in the Z-Z' direction of the vibration damper or dampers 300 on the X-direction side. As such, the vibration damper or dampers 300 on the X-direction side are held between the first abuttable portion 841 and the second abuttable portion 842 of the or each fixing hole 840 on the X-direction side.

Where the or each vibration damper 300 on the X-direction side includes neither at least one first protrusion 350 nor at least one second protrusion 360, the first vibration damper 310 of the or each vibration damper 300 on the X-direction side is interposed between the first abuttable portion 841 of the corresponding fixing hole 840 on the X-direction side and the corresponding fixable part 200 on the X-direction side, and the second vibration damper 320 of the or each vibration damper 300 on the X-direction side is interposed between the second abuttable portion 842 of the corresponding fixing hole 840 on the X-direction side and the corresponding fixable part 200 on the X-direction side.

Where the or each vibration damper 300 on the X-direction side includes at least one first protrusion 350 but not at least one second protrusion 360, the first vibration damper 310 of the or each vibration damper 300 on the X-direction side abuts the corresponding fixable part 200, the at least one first protrusion 350 of the or each vibration damper 300 on the X-direction side is held between the or each first vibration damper 310 and the first abuttable portion 841 of the corresponding fixing hole 840 on the X-direction side, and the second vibration damper 320 of the or each vibration damper 300 on the X-direction side is interposed between the second abuttable portion 842 of the corresponding fixing hole 840 on the X-direction side and the corresponding fixable part 200 on the X-direction side.

When the or each vibration damper 300 on the X-direction side does not include the at least one first protrusion 350 but at least one second protrusion 360, the first vibration damper 310 of the or each vibration damper 300 on the X-direction side is interposed between the first abuttable portion 841 of the corresponding fixing hole 840 on the X-direction side and the corresponding fixable part 200 on the X-direction side, the second vibration damper 320 of the or each vibration damper 300 on the X-direction side abuts the corresponding fixable part 200, and the at least one second protrusion 360 of the or each vibration damper 300 on the X-direction side is held between the or each second vibration damper 320 and the second abuttable portion 842 of the corresponding fixing hole 840 on the X-direction side.

Where the or each vibration damper 300 on the X-direction side includes at least one first protrusion 350 and at least one second protrusion 360, the first vibration damper 310 of the or each vibration damper 300 on the X-direction side abuts the corresponding fixable part 200, the at least one first protrusion 350 of the or each vibration damper 300 on the X-direction side is held between the or each first vibration damper 310 and the first abuttable portion 841 of the corresponding fixing hole 840 on the X-direction side, the second vibration damper 320 of the or each vibration damper 300 on the X-direction side abuts the corresponding fixable part 200, and the at least one second protrusion 360 of the or each vibration damper 300 on the X-direction side is held between the or each second vibration damper 320 and the second abuttable portion 842 of the corresponding fixing hole 840 on the X-direction side.

In any of the above aspects, the vibration damper or dampers 300 and the fixable part parts 200 on the X-direction side are fixed to the relay 800 on the X-direction side. Likewise, the vibration damper or dampers 300 and the fixable part parts 200 on the X'-direction side are fixed to the relay 800 on the X'-direction side.

Where the plurality of fixable parts 200 and the plurality of vibration dampers 300 are provided in a one-to-multiple relationship, they may have configuration (l) above. In this case, the coupling portions 330 of more than one of the vibration dampers 300 fit in the attaching hole 210 of the or each fixable part 200 on the X-direction side, and the or each fixable part 200 on the X-direction side and the vibration dampers 300 thus fitted are received and fixed in the corresponding fixing hole 840 on the X-direction side from the X'-direction side. Also, the coupling portions 330 of more than one of the vibration dampers 300 fit in the attaching hole 210 of the or each fixable part 200 on the X'-direction side, and the or each fixable part 200 on the X'-direction side and the vibration dampers 300 thus fitted are received and fixed in the corresponding fixing hole 840 on the X'-direction side from the X-direction side. In other respects, the fixable parts 200 and the vibration dampers 300 in a one-to-multiple relationship may have the same configuration as those in a one-to-one relationship.

In any of the configurations above in which each of the fixable parts 200 is provided with a plurality of cutouts 220, the cutouts 220 of each fixable part 200 may be replaced with a plurality of insertion holes 230.

Each of the relay 800 on the X-direction side and the relay 800 on the X'-direction side includes a plurality of communicating holes 820 or a plurality of engagement holes 830. Where the communicating holes 820 are provided, each of the relays 800 on the X- and X'-direction sides are configured such that in the above-described accommodation state, screws 900 are received through the corresponding communicating holes 820 and screwed (that is, fixed) to corresponding screw holes 14 of a perimeter area 12 of a housing 10. Where the engagement holes 830 are provided, in the above-described accommodation state, a plurality of engaging portions 15 of the perimeter area 12 of the housing 10 are engaged with the plurality of engagement holes 830 in a manner described above, so that the relays 800 on the X- and X'-direction sides are fixed to the perimeter area 12 of the housing 10.

The sensor unit U3 and the structure S3 described above provide the following technical features and effects (11) and

(12) in addition to the above-described technical features and effects (3) to (5), (8), and (9) discussed for the sensor unit U2 and the structure S2.

Technical Feature and Effect (11): Where each of the vibration dampers 300 includes the at least one first protrusion 350, even if the vibratable unit is subjected to a large load from the Z'-direction side and thereby displaced in the Z direction, the at least one first protrusion 350 of each vibration damper 300 is compressed and contracts between the corresponding first vibration damper 310 and the corresponding first abuttable portion 841 so as to be buried in the first vibration damper 310. As a result, the first vibration damper 310 of each vibration damper 300 abuts the corresponding first abuttable portion 841, increasing the area of each vibration damper 300 that is in contact with the corresponding first abuttable portion 841, and thereby suppressing further expansion and contraction of each vibration damper 300 in the Z-Z' direction.

Technical Feature and Effect (12): Where each of the vibration dampers 300 includes the at least one second protrusion 360, even if the vibratable unit is subjected to a large load from the Z-direction side and thereby displaced in the Z' direction, the at least one second protrusion 360 of each vibration damper 300 is compressed and contracts between the corresponding second vibration damper 320 and the corresponding second abuttable portion 842 so as to be buried in the second vibration damper 320. As a result, the second vibration damper 320 of each vibration damper 300 abuts the second abuttable portion 842, increasing the area of each vibration damper 300 that is in contact with the corresponding second abuttable portion 842 increases, and thereby suppressing further expansion and contraction of each vibration damper 300 in the Z-Z' direction.

It should be noted that the sensor unit and the structure for attaching the sensor unit are not limited to the above embodiments, may be modified in any manner within the scope of the claims. Some examples of specific modification will be described below.

The fixable parts of the invention may be modified to at least one fixable part. Where a single fixable part 200 is provided, the fixable part 200 may be a ring-shaped flange extending in a direction crossing a Z-Z' direction from a second portion 102 of a body 100, or alternatively a perimeter area of the second portion 102. Except for being the ring-shaped flange, this single fixable part 200 may have the same configuration as the fixable part 200 of any of configurations (m) to (q) described above for the sensor units U1, U2, and U3. Particularly where the single fixable part 200 has configuration (p) or (q) above, the plurality of fixing parts may include first and second fixing parts, each of which may include a fastener 440 and a plurality of screws 400, and the single fixable part 200 may include an end portion on an X-direction side and an end portion on an X'-direction side. In this case, the abuttable portion 441 of the fastener 440 of the first fixing part abuts, from the Z'-direction side, a plurality of vibration dampers 300 fitting in the corresponding attaching holes 210 in the end portion on the X-direction side of the fixable part 200, and is screwed to the perimeter area 12 of the housing 10 or to the corresponding screw holes 810 of the at least one relay 800 with the screws 400 in a manner as described for configuration (p) or (q) above. Also, the abuttable portions 441 of the fastener 440 of the second fixing part abuts, from the Z'-direction side, a plurality of vibration dampers 300 fitting in the corresponding attaching holes 210 in the end portion on the X'-direction side of the fixable part 200, and is screwed to the perimeter area 12 of the housing 10 or to the corresponding screw holes 810 of the at least one relay 800 with the screws 400 in a manner as described for configuration (p) or (q) above. In addition, where the relays 800 on the X- and X'-direction sides have the fixing holes 840, the fixable part 200 being the flange is configured such that the end portion on the X-direction side of the fixable part 200 is provided with a plurality of attaching holes 210, this end portion and a plurality of vibration dampers 300 fitting in the attaching holes 210 are received in the fixing holes 840 of the relay 800 on the X-direction side and fixed as described above; and the end portion on the X'-direction side of the fixable part 200 is provided with a plurality of attaching holes 210, this end portion and a plurality of vibration dampers 300 fitting in the attaching holes 210 are received in the fixing holes 840 of the relay 800 on the X'-direction side and fixed as described above.

The vibration damper of the invention may be modified to at least one vibration damper. Where a single vibration damper 300 is provided, the vibration damper 300 may include a single ring-shaped first vibration damper 310, or include a single ring-shaped first vibration damper 310 and a single ring-shaped second vibration damper 320. In the former case, except for being the ring shape, the single first vibration damper 310 may have the same configuration as the first vibration damper 310 of configuration (m) described above for the sensor units U1 and U2. In the latter case, except for being the ring shape, the single first vibration damper 310 and the single second vibration damper 320 may have the same configuration as the first vibration damper 310 and the second vibration damper 320 of configuration (n) described above for the sensor units U1 and U2.

Of course, the single fixable part 200 and the single vibration damper 300 may generally be ring-shaped.

It should be noted that the first direction of the invention any direction in which the accommodation hole of the housing of the invention extends. The second direction of the invention may be any direction that crosses the first direction. The third direction of the invention may be any direction that crosses the first and second directions and that is not located on the plane on which the first and second directions extend.

REFERENCE SIGNS LIST

S1, S2, S3: structure for attaching a sensor unit
10: housing
  11: accommodation hole; 12: perimeter area; 13: mount; 14: screw hole
20: overlay
  21: covering portion; 22: cushioning portion;
U1, U2, U3: sensor unit
100: body
  101: first portion; 101a: first face; 102: second portion
200: fixable part
  210: attaching hole; 220: cutout; 230: insertion hole
300: vibration damper
  310: first vibration damper; 311: through-hole; 320: second vibration damper; 321: through-hole; 330: coupling portion; 340: through-hole; 350: first protrusion; 360: second protrusion
400: screw
  410: screw body; 420: head
430: washer
  431: through-hole
440: fastener
  441: abuttable portion; 441a: through-hole; 442: leg; 442a: through-hole 500: detection sensor
510: first face
600: vibration generator
700: circuit board
800: relay
810: screw hole; 820: communicating hole; 830: engagement hole
900: screw

What is claimed is:

1. A sensor unit attachable to an accommodation hole, the accommodation hole extending through a housing in a first direction and being closed by an overlay on one side in the first direction, the sensor unit being attachable to the accommodation hole from the other side in the first direction, the sensor unit comprising:
   a body including a first portion and a second portion on the other side in the first direction relative to the first portion, the first portion being accommodatable in the accommodation hole of the housing from the other side in the first direction, the second portion being located on the other side in the first direction relative to the accommodation hole with the first portion accommodated in the accommodation hole;
   a detection sensor provided at the body and configured to detect a contact of a detection target with the overlay from the one side in the first direction, with the first portion of the body accommodated in the accommodation hole;
   a vibration generator configured to vibrate the body and the detection sensor, with the first portion of the body accommodated in the accommodation hole, and thereby provide a tactile feedback to the detection target in contact with the overlay;
   a vibration damper constituted by an elastic substance; and
   a fixable part provided at the second portion of the body, the fixable part being located on the other side in the first direction relative to a perimeter area of the accommodation hole of the housing with the first portion of the body accommodated in the accommodation hole,
   wherein, with the first portion of the body accommodated in the accommodation hole, the fixable part is fixed to the perimeter area of the accommodation hole of the housing from the other side in the first direction via the vibration damper, and the vibration damper is at least partly interposed between the fixable part and the perimeter area of the accommodation hole of the housing.

2. The sensor unit according to claim 1, wherein the vibration damper includes:
   a first vibration damper constituted by an elastic substance; and
   at least one first protrusion being constituted by an elastic substance, extending from the first vibration damper to the one side in the first direction, and being elastically deformable such as to contract in the first direction, and
   with the first portion of the body accommodated in the accommodation hole, the fixable part is fixed to the housing from the other side in the first direction via the first vibration damper, the first vibration damper abuts the fixable part, and the at least one first protrusion is held between the first vibration damper and the housing.

3. The sensor unit according to claim 1, further comprising a fixing part including an abuttable portion, wherein with the first portion of the body accommodated in the accommodation hole, the fixing part is configured to fix the fixable part and the vibration damper to the housing from the other side in the first direction, and the abuttable portion is located on the other side in the first direction relative to the vibration damper,
   the vibration damper includes a first vibration damper constituted by an elastic substance and a second vibration damper constituted by an elastic substance, and
   in a state where the fixing part fixes the fixable part and the vibration damper to the housing from the other side in the first direction, the first vibration damper is interposed between the fixable part and the housing, and the second vibration damper is interposed between the fixable part and the abuttable portion of the fixing part.

4. The sensor unit according to claim 3, wherein the vibration damper further includes:
   at least one first protrusion being constituted by an elastic substance, extending from the first vibration damper to the one side in the first direction, and being elastically deformable such as to contract in the first direction, and
   at least one second protrusion being constituted by an elastic substance, extending from the second vibration damper to the other side in the first direction, and being elastically deformable such as to contract in the first direction, and
   in the state where the fixing part fixes the fixable part and the vibration damper to the housing from the other side in the first direction, the first vibration damper abuts the fixable part, the at least one first protrusion is held between the first vibration damper and the housing, the second vibration damper abuts the fixable part, and the at least one second protrusion is held between the second vibration damper and the abuttable portion of the fixing part.

5. A sensor unit attachable to an accommodation hole, the accommodation hole extending through a housing in a first direction and being closed by an overlay on one side in the first direction, the sensor unit being attachable to the accommodation hole from the other side in the first direction, the sensor unit comprising:
   a body including a first portion and a second portion on the other side in the first direction relative to the first portion, the first portion being accommodatable in the accommodation hole of the housing from the other side in the first direction, the second portion being located on the other side in the first direction relative to the accommodation hole with the first portion accommodated in the accommodation hole;
   a detection sensor provided at the body and configured to detect a contact of a detection target with the overlay from the one side in the first direction with the first portion of the body accommodated in the accommodation hole;
   a vibration generator configured to vibrate the body and the detection sensor, with the first portion of the body accommodated in the accommodation hole, and thereby provide a tactile feedback to the detection target in direct or indirect contact with the overlay;
   a fixable part provided at the second portion of the body, the fixable part being located on the other side in the first direction relative to a perimeter area of the accommodation hole of the housing with the first portion of the body accommodated in the accommodation hole,
   a relay fixed to the fixable part from the one side in the first direction, wherein, with the first portion of the body accommodated in the accommodation hole, the relay is fixed to the perimeter area of the accommodation hole of the housing from the other side in the first direction; and a vibration damper constituted by an elastic substance and at least partly interposed between the fixable part and the relay.

6. The sensor unit according to claim 5, wherein
the vibration damper includes:
a first vibration damper constituted by an elastic substance; and
at least one first protrusion being constituted by an elastic substance, extending from the first vibration damper to the one side in the first direction, and being elastically deformable such as to contract in the first direction, and
the relay includes a first abuttable portion located on the one side in the first direction relative to the at least one first protrusion, and
the first vibration damper abuts the fixable part, and the at least one first protrusion is held between the first vibration damper and the first abuttable portion of the relay.

7. The sensor unit according to claim 5, wherein
the vibration damper includes a first vibration damper constituted by an elastic substance and a second vibration damper constituted by an elastic substance, and
the relay includes a first abuttable portion located on the one side in the first direction relative to the first vibration damper, and a second abuttable portion located on the other side in the first direction relative to the second vibration damper,
the first vibration damper is interposed between the fixable part and the first abuttable portion of the relay, and
the second vibration damper is interposed between the fixable part and the second abuttable portion of the relay.

8. The sensor unit according to claim 7, wherein
the vibration damper further includes:
at least one first protrusion being constituted by an elastic substance, extending from the first vibration damper to the one side in the first direction, and being elastically deformable such as to contract in the first direction, and
at least one second protrusion being constituted by an elastic substance, extending from the second vibration damper to the other side in the first direction, and being elastically deformable such as to contract in the first direction,
the first vibration damper abuts the fixable part, and the at least one first protrusion is held between the first vibration damper and the first abuttable portion of the relay, and
the second vibration damper abuts the fixable part, and the at least one second protrusion is held between the second vibration damper and the second abuttable portion of the relay.

9. The sensor unit according to claim 1, wherein
the first portion of the body has a first face on the one side in the first direction,
the first face of the body has a shape and size, as viewed from the one side in the first direction, that is substantially the same as the shape and size of the accommodation hole of the housing, and
with the first portion of the body accommodated in the accommodation hole, the first face of the body is arranged substantially continuously with a face on the one side in the first direction of the perimeter area of the accommodation hole of the housing.

10. The sensor unit according to claim 5, wherein
the first portion of the body has a first face on the one side in the first direction,
the first face of the body has a shape and size, as viewed from the one side in the first direction, that is substantially the same as the shape and size of the accommodation hole of the housing, and
with the first portion of the body accommodated in the accommodation hole, the first face of the body is arranged substantially continuously with a face on the one side in the first direction of the perimeter area of the accommodation hole of the housing.

11. The sensor unit according to claim 1, wherein
the first portion of the body has a first face on the one side in the first direction,
the detection sensor has a first face on the one side in the first direction and a second face on the other side in the first direction,
the second face of the detection sensor abuts the first face of the body,
the detection sensor has a shape and size, as viewed from the one side in the first direction, that is substantially the same as the shape and size of the accommodation hole of the housing, and
with the first portion of the body accommodated in the accommodation hole, the first face of the detection sensor is arranged substantially continuously with a face on the one side in the first direction of the perimeter area of the accommodation hole of the housing.

12. The sensor unit according to claim 5, wherein
the first portion of the body has a first face on the one side in the first direction,
the detection sensor has a first face on the one side in the first direction and a second face on the other side in the first direction,
the second face of the detection sensor abuts the first face of the body,
the detection sensor has a shape and size, as viewed from the one side in the first direction, that is substantially the same as the shape and size of the accommodation hole of the housing, and
with the first portion of the body accommodated in the accommodation hole, the first face of the detection sensor is arranged substantially continuously with a face on the one side in the first direction of the perimeter area of the accommodation hole of the housing.

13. The sensor unit according to claim 1, wherein
the body is a tube with a bottom closing the one side in the first direction of the body, and
the vibration generator is accommodated in, and fixed to, the body.

14. The sensor unit according to claim 5, wherein
the body is a tube with a bottom closing the one side in the first direction of the body, and
the vibration generator is accommodated in, and fixed to, the body.

15. A structure for attaching a sensor unit, the structure comprising:
a housing provided with an accommodation hole, the accommodation hole extending through the housing in the first direction;

an overlay to close the accommodation hole of the housing from the one side in the first direction; and the sensor unit according to claim 1, wherein the first portion of the body of the sensor unit is accommodated in the accommodation hole, the body and/or the detection sensor of the sensor unit abuts the overlay, the fixable part of the sensor unit is fixed to the perimeter area of the accommodation hole of the housing from the other side in the first direction via the vibration damper, and the vibration damper of the sensor unit is at least partly interposed between the fixable part and the perimeter area of the accommodation hole of the housing.

16. A structure for attaching a sensor unit, the structure comprising:

a housing provided with an accommodation hole, the accommodation hole extending through the housing in the first direction;

an overlay to close the accommodation hole of the housing from the one side in the first direction; and a sensor unit according to claim 5, the sensor unit comprising:

a body including a first portion and a second portion on the other side in the first direction relative to the first portion, the first portion being accommodated in the accommodation hole of the housing from the other side in the first direction, the second portion being located on the other side in the first direction relative to the accommodation hole with the first portion accommodated in the accommodation hole;

a detection sensor provided at the body and configured to detect a contact of a detection target with the overlay from the one side in the first direction with the first portion of the body accommodated in the accommodation hole;

a vibration generator configured to vibrate the body and the detection sensor, with the first portion of the body accommodated in the accommodation hole, and thereby provide a tactile feedback to the detection target in direct or indirect contact with the overlay;

a fixable part provided at the second portion of the body, the fixable part being located on the other side in the first direction relative to a perimeter area of the accommodation hole of the housing with the first portion of the body accommodated in the accommodation hole, a relay fixed to the fixable part from the one side in the first direction, wherein, with the first portion of the body accommodated in the accommodation hole, the relay is fixed to the perimeter area of the accommodation hole of the housing from the other side in the first direction; and a vibration damper constituted by an elastic substance and at least partly interposed between the fixable part and the relay, wherein the body and/or the detection sensor of the sensor unit abuts the overlay.

17. The structure according to claim 15, wherein the overlay is made of a flexible and/or elastic material and covers at least a perimeter area of the accommodation hole of the housing and the body of the sensor unit.

18. The structure according to claim 16, wherein the overlay is made of a flexible and/or elastic material and covers at least a perimeter area of the accommodation hole of the housing and the body of the sensor unit.

19. The structure according to claim 15, wherein the overlay includes:

a cushioning portion being made of an elastic material, closing the accommodation hole of the housing from the one side in the first direction, and covering at least a perimeter area of the accommodation hole of the housing and the body of the sensor unit, and a covering portion covering the cushioning portion from the one side in the first direction, and the body and/or the detection sensor abuts the cushioning portion.

20. The structure according to claim 16, wherein the overlay includes:

a cushioning portion being made of an elastic material, closing the accommodation hole of the housing from the one side in the first direction, and covering at least a perimeter area of the accommodation hole of the housing and the body of the sensor unit, and a covering portion covering the cushioning portion from the one side in the first direction, and the body and/or the detection sensor abuts the cushioning portion.

21. The structure according to claim 19, wherein the cushioning portion is recessed conforming to a shape of the detection sensor.

22. The structure according to claim 20, wherein the cushioning portion is recessed conforming to a shape of the detection sensor.

23. The sensor unit according to claim 1, wherein with the first portion of the body accommodated in the accommodation hole, the fixable part is fixed to a mount of the perimeter area of the accommodation hole of the housing from the other side in the first direction via the vibration damper, the mount protruding to the other side in the first direction, and the vibration damper is at least partly interposed between the fixable part and the mount of the housing.

24. The sensor unit according to claim 5, wherein the relay is provided separately from the body.

* * * * *